US012738220B2

(12) United States Patent
Lu et al.

(10) Patent No.: US 12,738,220 B2
(45) Date of Patent: Sep. 15, 2026

(54) DISPLAY PANEL AND DISPLAY DEVICE

(71) Applicant: BOE Technology Group Co., Ltd., Beijing (CN)

(72) Inventors: Jiangnan Lu, Beijing (CN); Tian Dong, Beijing (CN); Xuliang Zhao, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/993,580

(22) PCT Filed: May 24, 2023

(86) PCT No.: PCT/CN2023/096122
§ 371 (c)(1),
(2) Date: Jan. 13, 2025

(87) PCT Pub. No.: WO2024/239289
PCT Pub. Date: Nov. 28, 2024

(65) Prior Publication Data
US 2026/0031034 A1 Jan. 29, 2026

(51) Int. Cl.
*G09G 3/3233* (2016.01)
*H10K 59/12* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ......... G09G 3/3233; G09G 2300/0426; G09G 2300/043; G09G 2310/08;
(Continued)

(56) References Cited

U.S. PATENT DOCUMENTS

2019/0018526 A1 1/2019 Fu et al.
2023/0165083 A1* 5/2023 Park ..................... H10K 59/131 257/40
(Continued)

FOREIGN PATENT DOCUMENTS

CN 114999382 A 9/2022
CN 115101575 A 9/2022
(Continued)

OTHER PUBLICATIONS

International Search Report mailed on Dec. 21, 2023, received for PCT Application PCT/CN2023/096122, filed on May 24, 2023, 4 pages including English Translation.
(Continued)

*Primary Examiner* — Douglas Wilson
(74) *Attorney, Agent, or Firm* — XSENSUS LLP

(57) ABSTRACT

A display panel includes a base substrate, a first metal layer, and a second metal layer. The first metal layer is located on a side of the base substrate. The first metal layer includes a plurality of fan-out transposition lines. The second metal layer is located on a side of the first metal layer facing away from the base substrate. The second metal layer includes a plurality of data signal lines and a plurality of data fan-out lines. At least some of the data signal lines distant from a middle area of the display panel are connected to the fan-out transposition lines by means of via holes, and the fan-out transposition lines are further connected to the data fan-out lines proximate to the middle area of the display panel by means of via holes.

19 Claims, 22 Drawing Sheets

(51) Int. Cl.

| | |
|---|---|
| ***H10K 59/121*** | (2023.01) |
| ***H10K 59/131*** | (2023.01) |
| *H10K 59/35* | (2023.01) |

(52) U.S. Cl.
CPC . *H10K 59/1315* (2023.02); *G09G 2300/0426* (2013.01); *G09G 2300/043* (2013.01); *G09G 2310/08* (2013.01); *G09G 2330/021* (2013.01); *H10K 59/12* (2023.02); *H10K 59/121* (2023.02); *H10K 59/131* (2023.02); *H10K 59/35* (2023.02)

(58) Field of Classification Search
CPC ......... G09G 2330/021; H10K 59/1213; H10K 59/1216; H10K 59/1315; H10K 59/12; H10K 59/131; H10K 59/121; H10K 59/35
See application file for complete search history.

(56) References Cited

U.S. PATENT DOCUMENTS

| | | | | |
|---|---|---|---|---|
| 2023/0189590 | A1* | 6/2023 | Choi | H10K 59/00 |
| 2023/0230533 | A1* | 7/2023 | Kim | G09G 3/2081 345/211 |
| 2024/0046873 | A1* | 2/2024 | Roh | G09G 3/3233 |
| 2024/0119900 | A1* | 4/2024 | Kim | G09G 3/3233 |

FOREIGN PATENT DOCUMENTS

| | | | |
|---|---|---|---|
| CN | 115274708 | A | 11/2022 |
| CN | 115732509 | A | 3/2023 |
| CN | 116053283 | A | 5/2023 |
| WO | 2023010944 | A1 | 2/2023 |

OTHER PUBLICATIONS

Written Opinion mailed on Dec. 21, 2023, received for PCT Application PCT/CN2023/096122, filed on May 24, 2023, 5 pages including English Translation.

* cited by examiner

DISPLAY PANEL AND DISPLAY DEVICE

CROSS-REFERENCE TO RELATED APPLICATION

The present disclosure is the U.S. national phase application of International Application No. PCT/CN2023/096122 filed on May 24, 2023, the content of which is incorporated herein by reference in its entirety for all purposes.

TECHNICAL FIELD

The present disclosure relates to the field of display technology, in particular, to a display panel and a display device.

BACKGROUND

There is a large demand for High Frame Rate AMOLED display panels in present market. High Frame Rate panels in the related art cannot achieve extremely narrow lower borders, and cannot meet the operating requirements.

It should be noted that the information disclosed in above section is only for the purpose of enhancing the understanding of the background of the present disclosure, and thus can include information that does not constitute prior art already known to those of ordinary skill in the art.

SUMMARY

According to a first aspect of the present disclosure, a display panel is provided. The display panel includes multiple pixel driving circuits arranged in an array along a first direction and a second direction, wherein the multiple pixel driving circuits include first pixel driving circuits and second pixel driving circuits distributed at intervals along the second direction, the second direction intersects with the first direction, and the display panel further includes: a base substrate; a first metal layer located on a side of the base substrate, wherein the first metal layer includes multiple fan-out transposition lines, and orthographic projections on the base substrate of the multiple fan-out transposition lines extend along the first direction; and a second metal layer located on a side of the first metal layer away from the base substrate, wherein the second metal layer includes multiple data signal lines and multiple data fan-out lines, orthographic projections on the base substrate of the multiple data signal lines extend along the second direction and are distributed at intervals along the first direction, and orthographic projections on the base substrate of the multiple data fan-out lines extend along the second direction and are distributed at intervals along the first direction; wherein the multiple data signal lines include multiple first data signal lines and multiple second data signal lines alternately distributed along the first direction, a pixel column corresponds to one of the first data signal lines and one of the second data signal lines, and the first data signal line and the second data signal line are arranged on both sides of the pixel column that the first data signal line and the second data signal line correspond to, and wherein the first data signal line is connected to the first pixel driving circuits, and the second data signal line is connected to the second pixel driving circuits; and wherein at least some of the data signal lines far away from a middle area of the display panel are connected to the fan-out transposition lines, and the fan-out transposition lines are further connected to the data fan-out lines close to the middle area of the display panel.

According to a second aspect of the present disclosure, a display device is provided. The display device includes a display panel as described in the first aspect of the present disclosure.

It should be understood that the general description in the above and the detailed description in the following are only illustrative and explanatory, and do not limit the present disclosure.

BRIEF DESCRIPTION OF THE DRAWINGS

The drawings herein, which are incorporated in and constitute a portion of this specification, illustrate embodiments consistent with the present disclosure and serve together with the specification to explain principles of the present disclosure. It is apparent that the drawings in the following description are only some embodiments of the present disclosure, and other drawings can be obtained based on the drawings by those of ordinary skill in the art without creative efforts.

DETAILED DESCRIPTION

Figure 1:
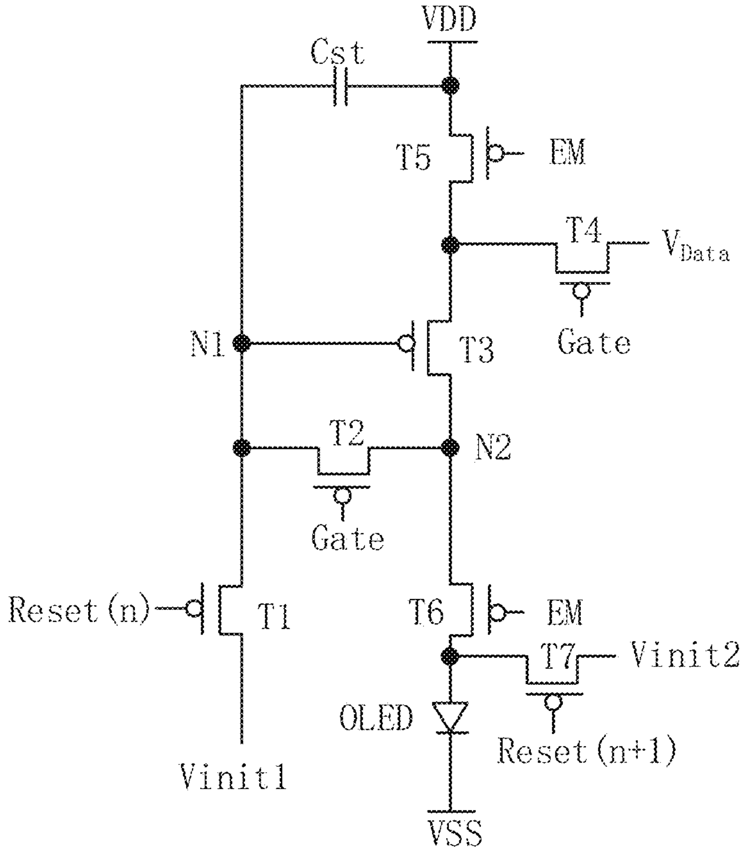
FIG. 1 is a schematic diagram of a circuit structure of a pixel driving circuit in a display panel according to embodiments of the present disclosure.

Example embodiments will now be described more fully with reference to the drawings. However, example embodiments can be implemented in a variety of forms and should not be construed as being limited to the embodiments set forth herein. Rather, the provision of these embodiments makes the present disclosure comprehensive and complete and conveys ideas of the example embodiments in a comprehensive manner to those skilled in the art. The same reference numerals in the drawings indicate the same or similar structures, and thus their detailed description will be omitted. In addition, the drawings are only schematic illustrations of the present disclosure and are not necessarily drawn to scale.

FIG. 1 is a schematic diagram of a circuit structure of a pixel driving circuit in a display panel according to embodiments of the present disclosure. The pixel driving circuit can include a first transistor T1, a second transistor T2, a driving transistor T3, a fourth transistor T4, a fifth transistor T5, a sixth transistor T6, a seventh transistor T7, and a storage capacitor C. In some embodiments, a first electrode of the first transistor T1 is connected to a first initial signal terminal Vinit1, a second electrode of T1 is connected to a first node N1, and a gate of T1 is connected to a first reset signal terminal Reset(n). A first electrode of the second transistor T2 is connected to a gate of the driving transistor T3, a second electrode of T2 is connected to a first electrode of the driving transistor T3, and a gate of T2 is connected to a gate signal terminal Gate. The gate of the driving transistor T3 is connected to the first node N1. A second electrode of the fourth transistor T4 is connected to a data signal terminal $V_{Data}$, a first electrode of T4 is connected to a second electrode of the driving transistor T3, and a gate of T4 is connected to the gate signal terminal Gate. A second electrode of the fifth transistor T5 is connected to the second electrode of the driving transistor T3, a first electrode of T5 is connected to a first power supply terminal VDD, and a gate of T5 is connected to an enable signal terminal EM. A first electrode of the sixth transistor T6 is connected to the first electrode of the driving transistor T3, and a gate of T6 is connected to the enable signal terminal EM. A first electrode of the seventh transistor T7 is connected to a second initial signal terminal Vinit2, a second electrode of T7 is connected to a second electrode of the sixth transistor T6, and a gate of T7 is connected to a second reset signal terminal Reset(n+1). A first electrode plate of the storage capacitor C is connected to the first node N1, and a second electrode plate of the storage capacitor C is connected to the first power supply terminal VDD. The pixel driving circuit can be connected to a light-emitting unit OLED, for driving the light-emitting unit OLED to emit light. The light-emitting unit OLED can be connected between the second electrode of the sixth transistor T6 and a second power supply terminal VSS. In some embodiments, each transistor disclosed in the present disclosure can be a P-type transistor, for example, all of the first transistor T1 to the seventh transistor T7 can be P-type low-temperature polycrystalline silicon transistors. The P-type low-temperature polycrystalline silicon transistor has high carrier mobility, which is conducive to achieving high resolution, high reaction speed, high pixel density, and high aperture ratio of the display panel. The first initial signal terminal Vinit1 and the second initial signal terminal Vinit2 can output the same or different voltage signals according to the actual situation.

It should be noted that the transistors selected in each embodiment of the present disclosure can be thin film transistors, field-effect transistors, or other devices with similar characteristics. In the present disclosure, the first electrode can be a drain electrode, and the second electrode can be a source electrode, alternatively, the first electrode can be the source electrode and the second electrode can be the drain electrode.

Figure 2:
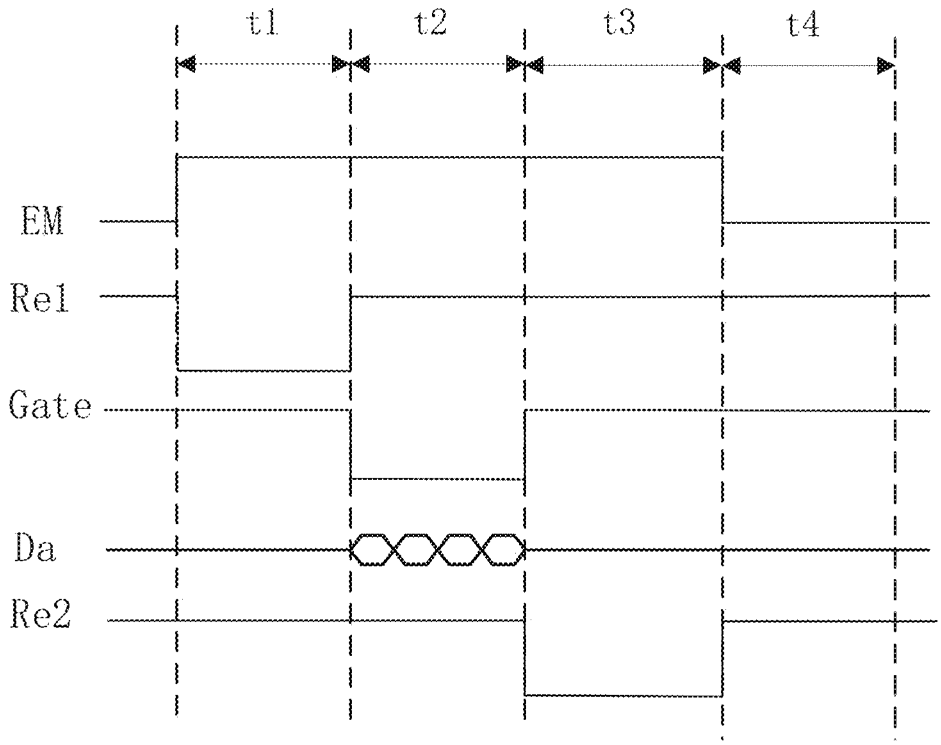
FIG. 2 is a timing diagram of a driving method for the pixel driving circuit in FIG. 1 including each node.

FIG. 2 is a timing diagram of a driving method for the pixel driving circuit in FIG. 1 including each node. As shown in FIG. 2, Gate represents the timing of the gate signal terminal Gate, Re1 represents the timing of the first reset signal terminal Reset(n), Re2 represents the timing of the second reset signal terminal Reset(n+1), EM represents the timing of the enable signal terminal EM, and Da represents the timing of the data signal terminal $V_{Data}$. The driving method for the pixel driving circuit an include a first reset stage t1, a compensation stage t2, a second reset stage t3, and a light-emitting stage t4. In the first reset stage t1, the first reset signal terminal Reset(n) outputs a low-level signal, the first transistor T1 is turned on, and the first initial signal terminal Vinit1 outputs a first initial signal to the first node N1. In the compensation stage t2, the gate signal terminal Gate outputs a low-level signal, and the second transistor T2 and the fourth transistor T4 are turned on. At the same time, the data signal terminal $V_{Data}$ outputs a data signal to write a voltage Vdata+Vth (i.e., a sum of voltages Vdata and Vth) into the first node N1, where Vdata is a voltage of a driving signal, and Vth is a threshold voltage of the driving transistor T3. In the second reset stage t3, the second reset signal terminal Reset(n+1) outputs a low-level signal, the seventh transistor T7 is turned on, and the second initial signal terminal Vinit2 outputs a second initial signal to the second electrode of the sixth transistor T6. In the light-emitting stage t4, the enable signal terminal EM outputs a low-level signal, the sixth transistor T6 and the fifth transistor T5 are turned on, and the driving transistor T3 provides a driving current in the presence of the voltage Vdata+Vth stored in the storage capacitor C, causing the light-emitting device OLED to emit light.

According to the output current formula of the driving transistor, $I=(\mu WCox/2L)(Vgs-Vth)^2$, where μ is the carrier mobility, Cox is the unit area storage capacity of the gate, W is the channel width of the driving transistor, L is the channel length of the driving transistor, Vgs is the voltage difference between the gate and the source of the driving transistor, and Vth is the threshold voltage of the driving transistor. The output current of the driving transistor in the pixel driving circuit of the present disclosure is $I=(\mu WCox/2L)(Vdata+Vth-Vdd-Vth)^2$. The pixel driving circuit can avoid the impact of changes in the threshold voltage of the driving transistor on the output current of the pixel driving circuit.

Figure 3:
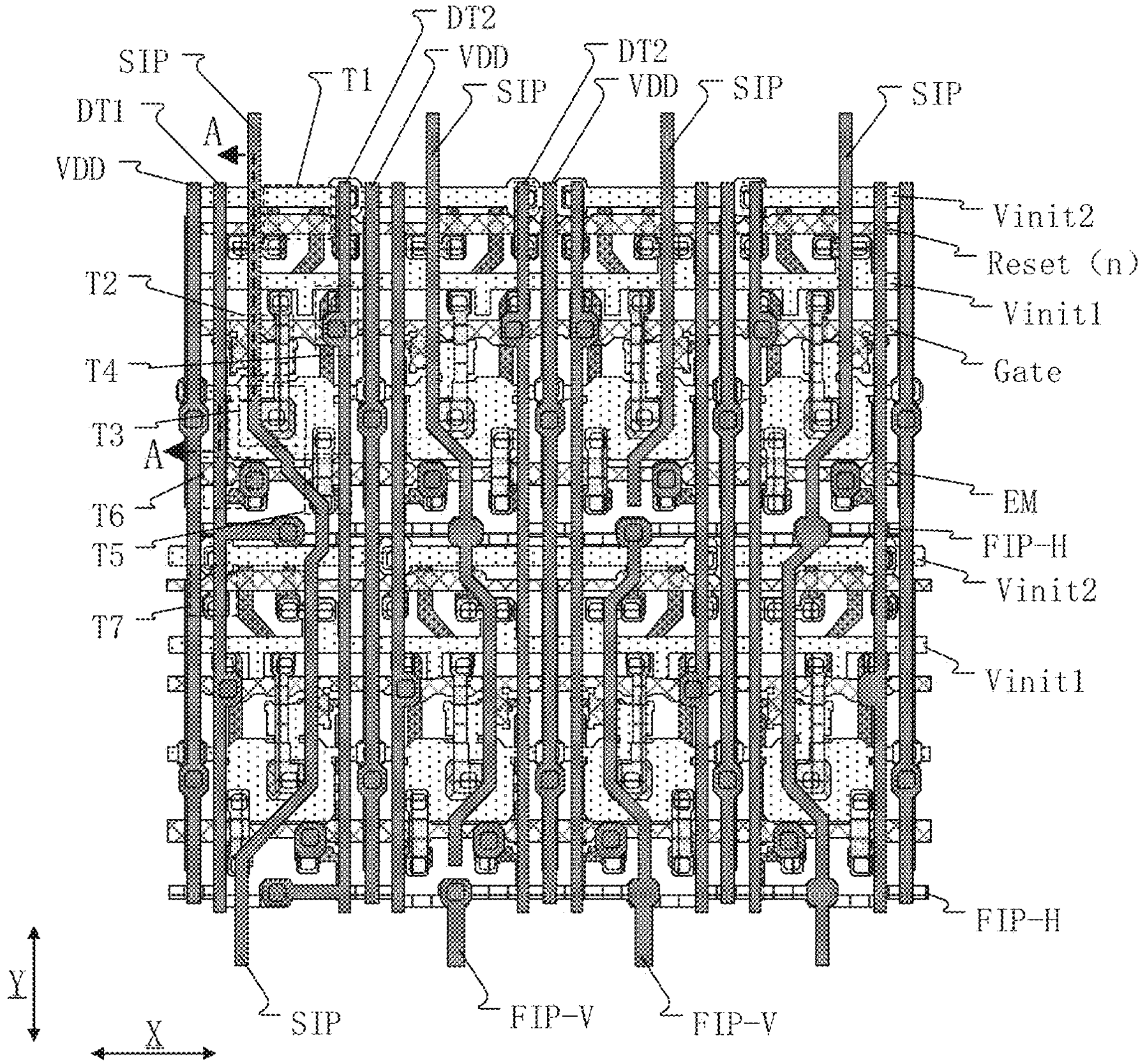
FIG. 3 is a structure layout of a display panel according to embodiments of the present disclosure.

The display panel provided in the present disclosure can include multiple pixel driving circuits arranged in an array along a first direction X and a second direction Y. The first direction X can be a row direction and the second direction Y can be a column direction. The pixel driving circuit is used to drive the light-emitting device to emit light. The pixel driving circuit can be as shown in FIG. 1. In some other embodiments, the pixel driving circuit in the display panel can also be of other structures, such as 8TIC, 9TIC, etc. FIG. 3 is a structure layout of a display panel according to embodiments of the present disclosure, and as shown in FIG. 3, the display panel provided in embodiments of the present disclosure can include a base substrate, a first metal layer, and a second metal layer. The first metal layer is located on a side of the base substrate, and the first metal layer includes multiple fan-out transposition lines FIP-H. Orthographic projections of the multiple fan-out transposition lines FIP-H on the base substrate extend along the first direction X. The second metal layer is located on a side of the first metal layer away from the base substrate. The second metal layer can include multiple data signal lines Data and multiple data fan-out lines FIP-V. Orthographic projections of the multiple data signal lines Data on the base substrate extend along the second direction Y and are distributed at intervals along the first direction X. The second direction Y intersects with the first direction X. Orthographic projections of the multiple data fan-out lines FIP-V on the base substrate extend along the second direction Y and are distributed at intervals along the first direction X. In some embodiments, at least some of the data signal lines Data located far away from a middle area of the display panel are connected to the fan-out transposition lines FIP-H through via holes, and the fan-out transposition lines FIP-H are also connected to the data fan-out lines FIP-V near the middle area through via holes.

In the display panel provided in embodiments of the present disclosure, the data signal line Data near side areas of the panel are trans positioned to the middle area of the panel through the fan-out transposition lines FIP-H in the first metal layer, and are connected to the data fan-out lines FIP-V in the second metal layer, so that some of the data signal lines Data near the side areas of the panel are trans positioned to the middle area of the panel, and are leaded out from the middle area of the panel, thereby reducing the size of the lower border and achieving an extremely narrow lower border.

It can be understood that the display panel can include two side areas arranged relatively along the first direction. The data signal lines far away from the middle area of the display panel can be understood as the data signal lines close to the side areas of the display panel. Correspondingly, the data fan-out lines close to the middle area of the display panel can be understood as the data fan-out lines far away from the side areas of the display panel. In other words, the present disclosure aims to reduce the size of the lower border of the display panel by using the first metal layer to arrange the wiring of the data signal lines located close to the side areas of the display panel in another layer, and then leading the data signal lines out in the area far away from the side areas of the display panel.

In addition, it can be understood that the display panel provided in embodiments of the present disclosure can include multiple conductive layers/metal layers, with insulating layers between adjacent conductive layers/metal layers. The conductive structures located in different metal layers/conductive layers can be electrically connected through via holes located in the insulating layers. Unless otherwise specified, the connections between conductive structures in different layers can be understood as being connected through via holes.

The solutions of the present disclosure will be introduced in detail in the following with reference to the drawings.

Figure 4:
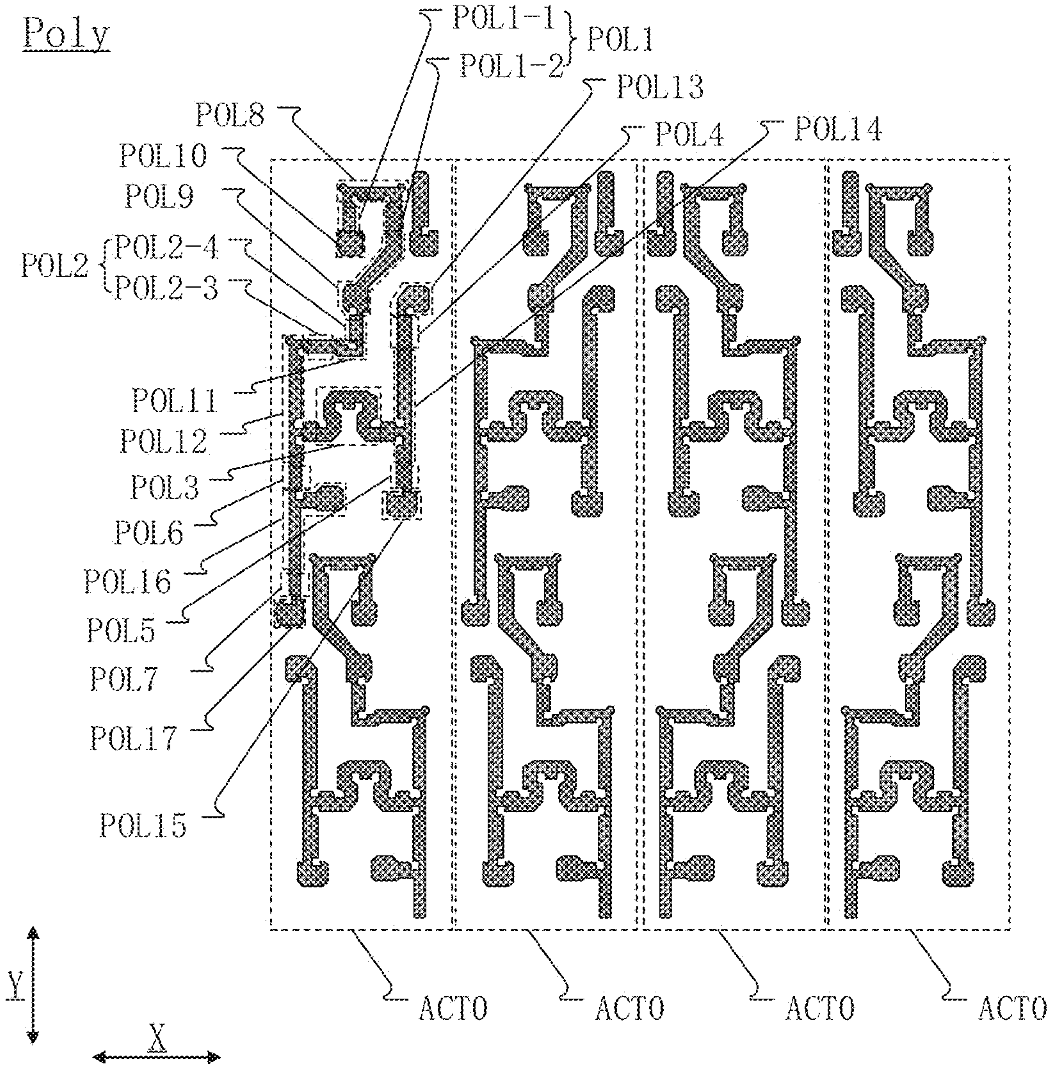
FIG. 4 is a structure layout of an active layer in FIG. 3.
Figure 5:
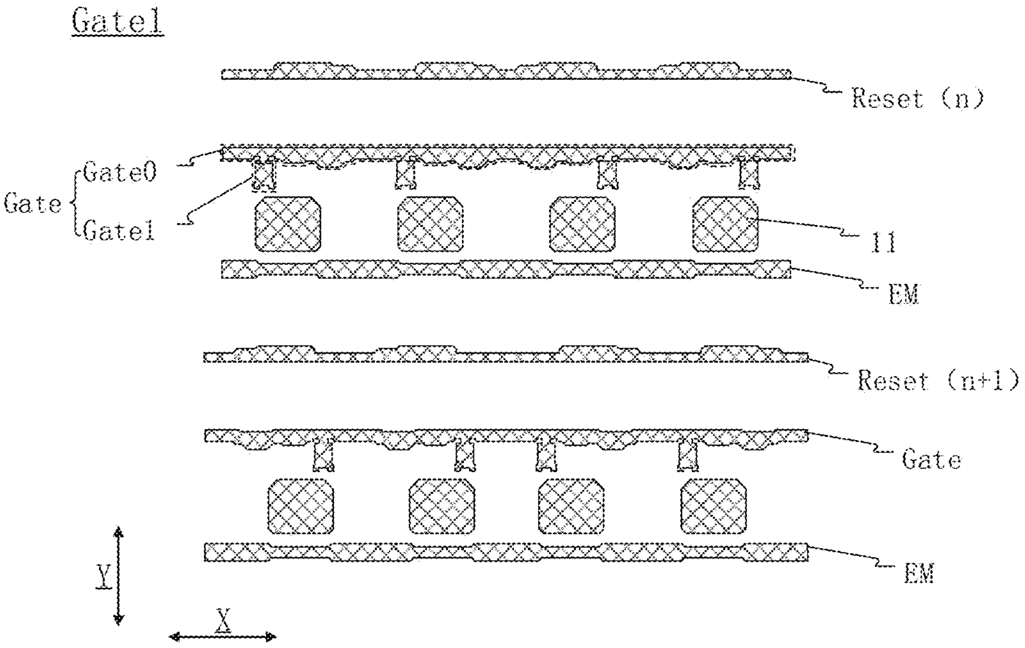
FIG. 5 is a structure layout of a first conductive layer in FIG. 3.
Figure 6:
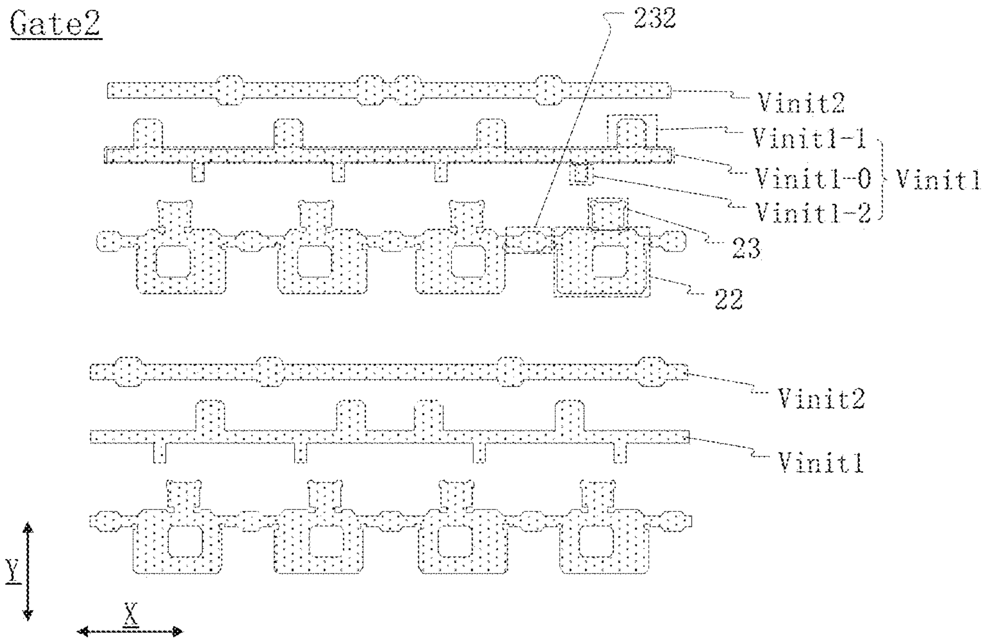
FIG. 6 is a structure layout of a second conductive layer in FIG. 3.
Figure 7:
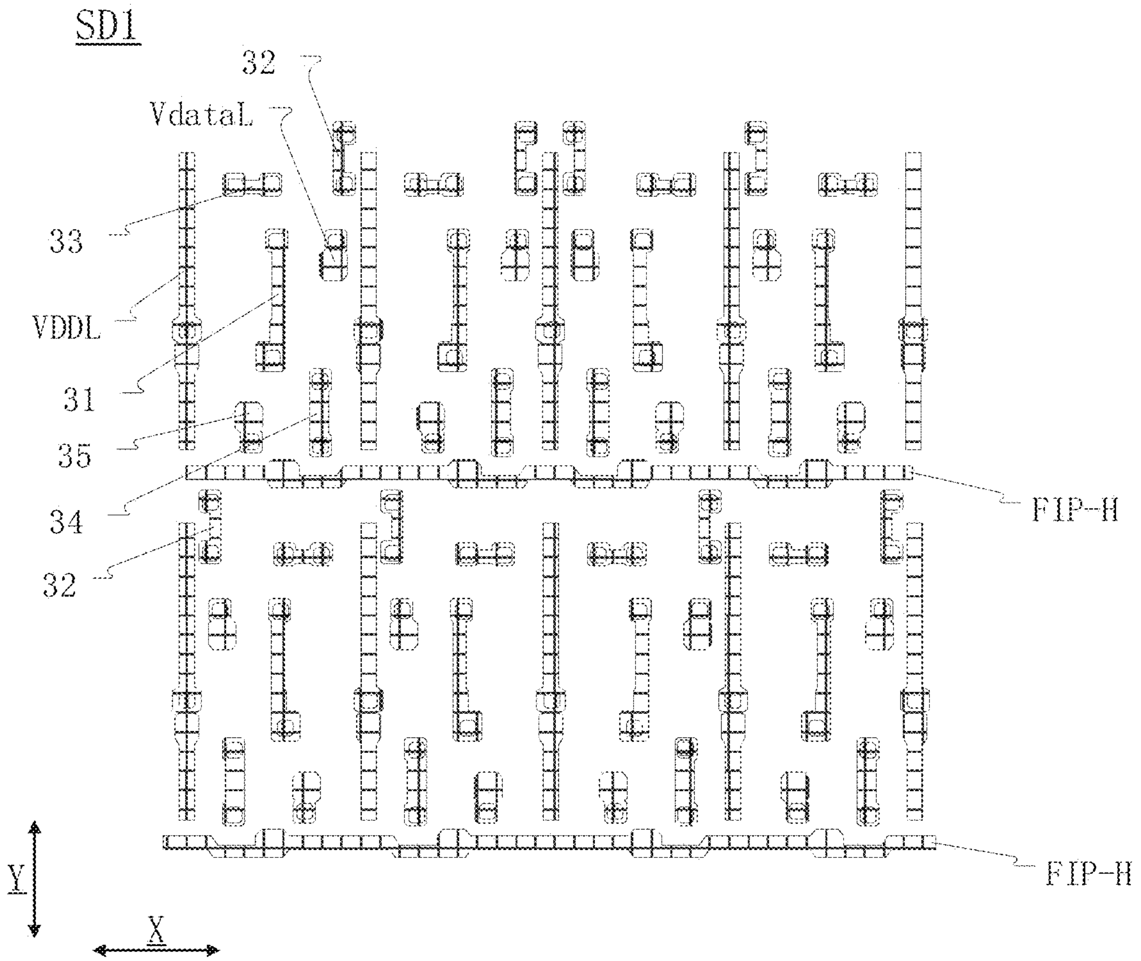
FIG. 7 is a structure layout of a first source-drain metal layer in FIG. 3.
Figure 8:
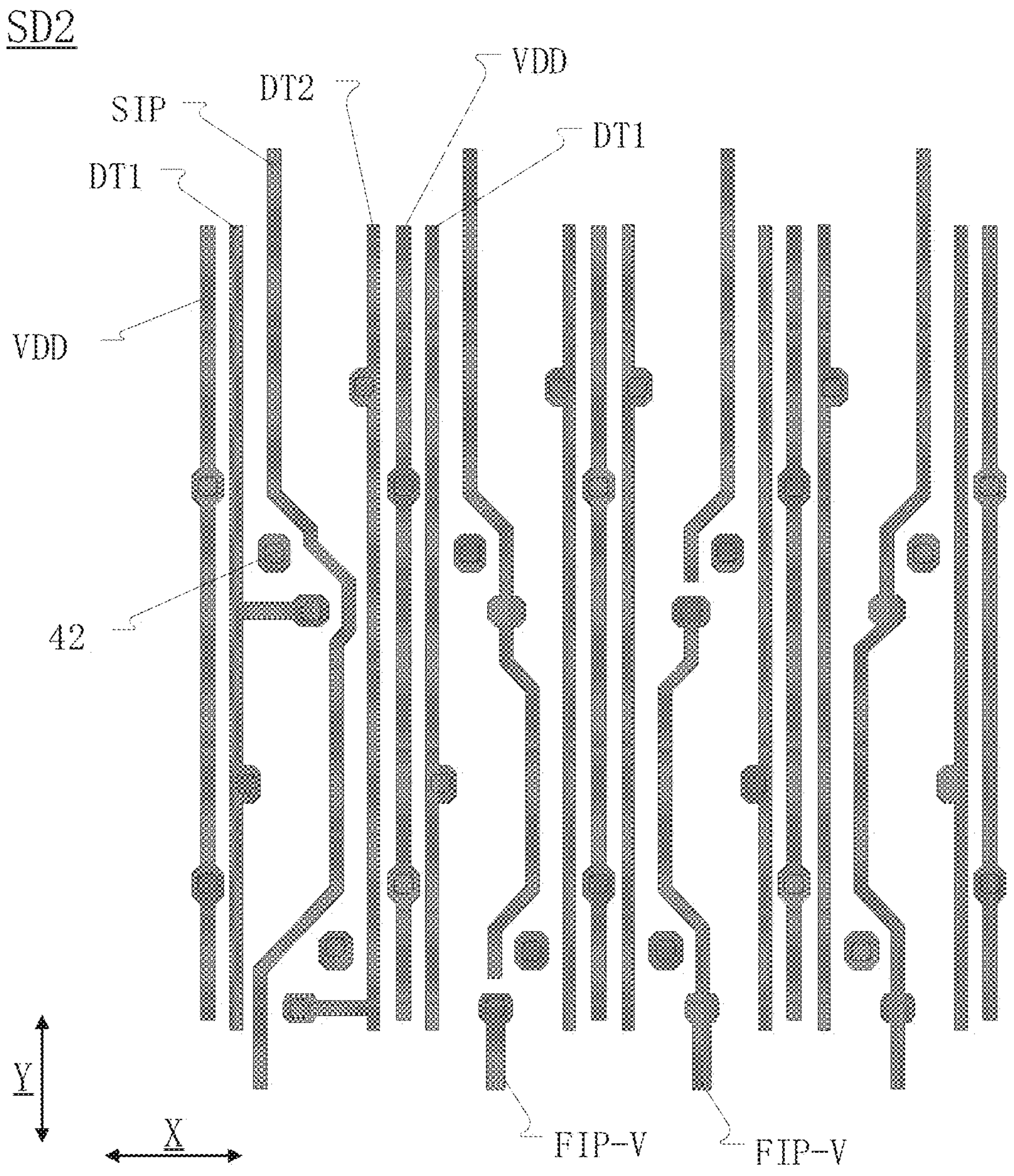
FIG. 8 is a structure layout of a second source-drain metal layer in FIG. 3.
Figure 9:
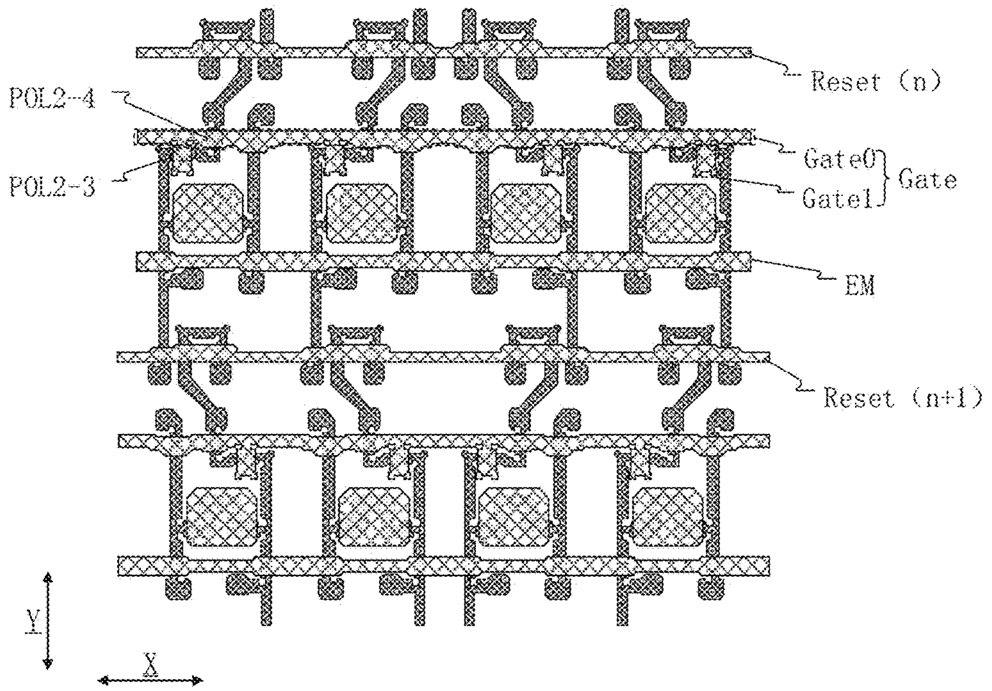
FIG. 9 is a stacked layout of an active layer and a first conductive layer in FIG. 3.
Figure 10:
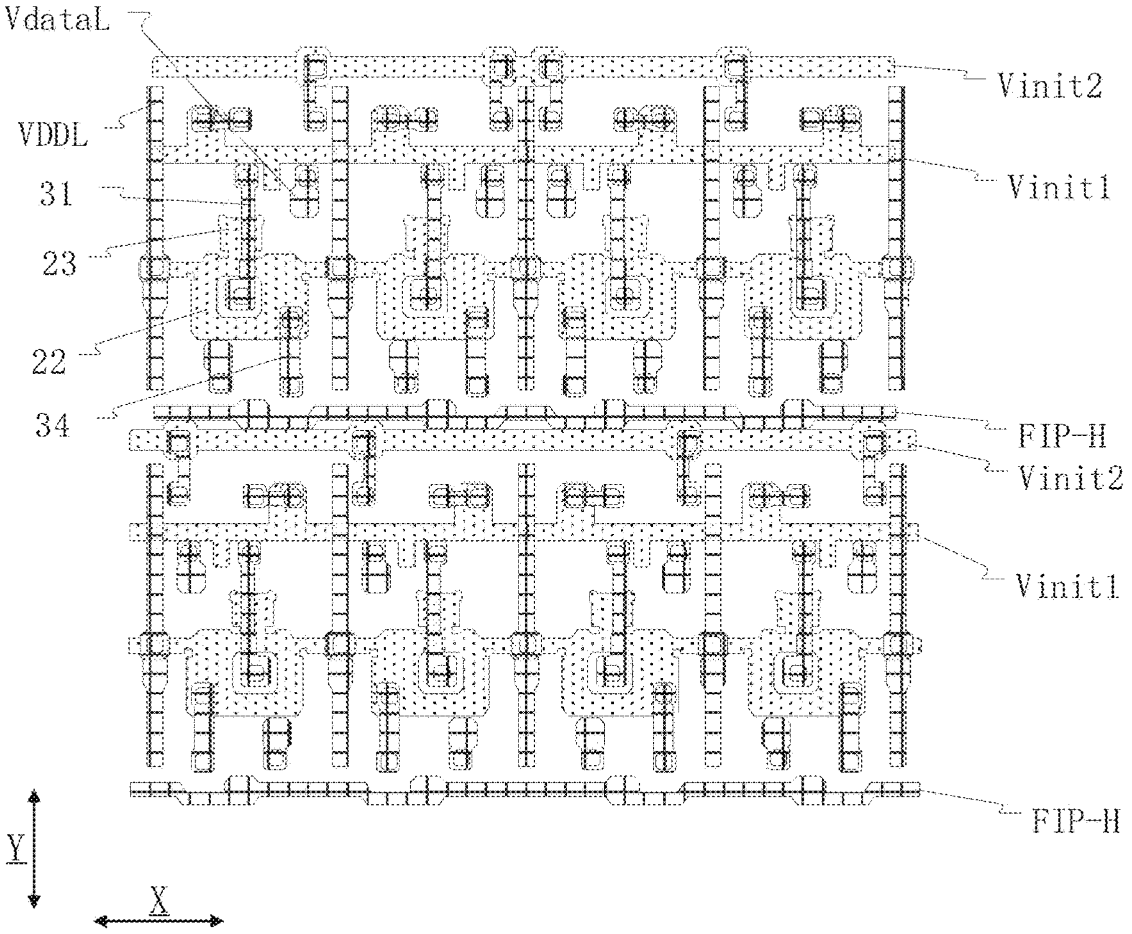
FIG. 10 is a stacked layout of a second conductive layer and a first source-drain metal layer in FIG. 3.
Figure 11:
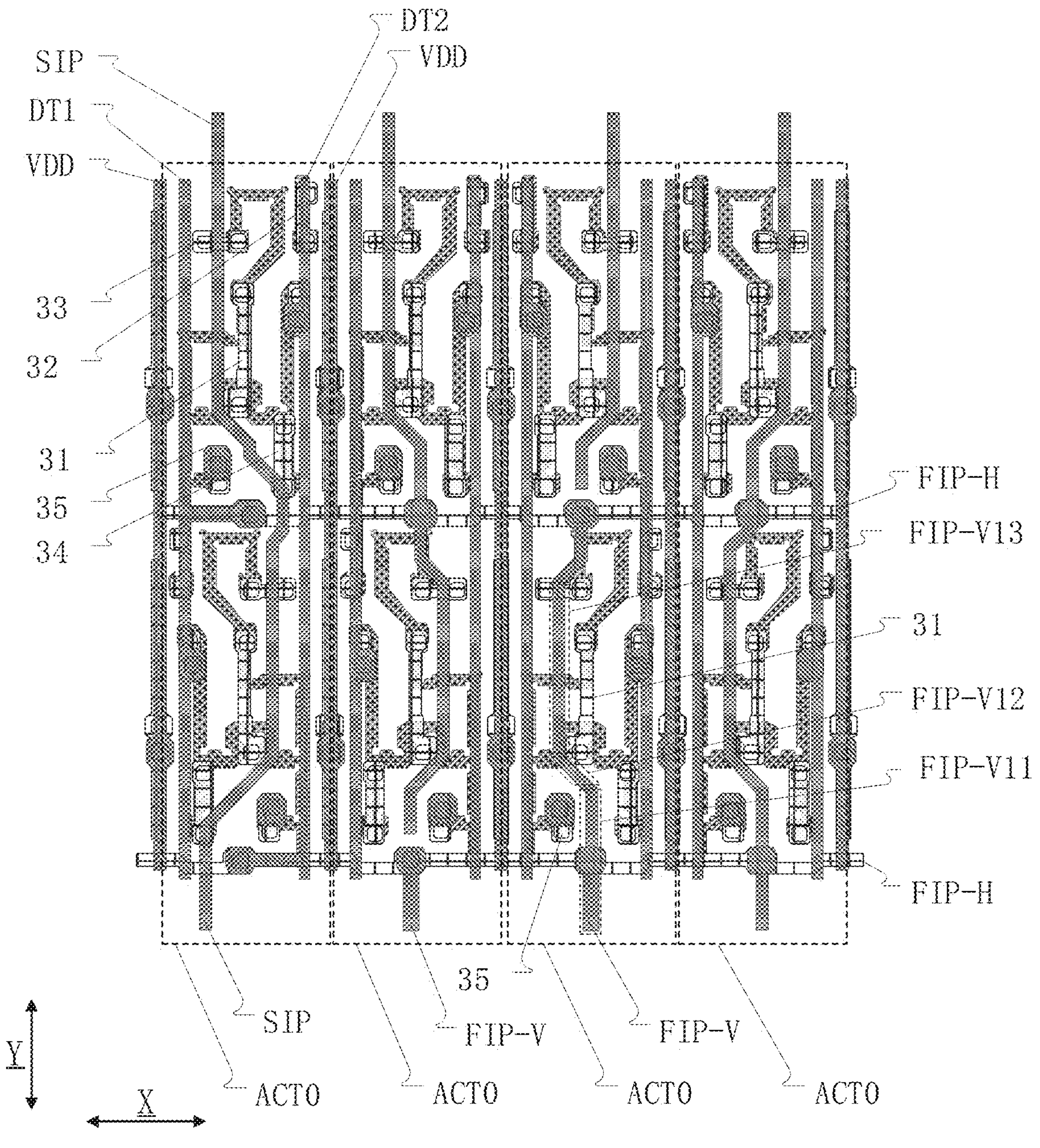
FIG. 11 is a stacked layout of an active layer, a first source-drain metal layer, and a second source-drain metal layer in FIG. 3.

In some embodiments, the first metal layer can be a first source-drain metal layer SD1, and the second metal layer can be a second source-drain metal layer SD2. The display panel provided in embodiments of the present disclosure can further include an active layer Poly, a first conductive layer Gate1, and a second conductive layer Gate2. In some embodiments, the base substrate, the active layer Poly, the first conductive layer Gate1, the second conductive layer Gate2, the first source-drain metal layer SD1, and the second source-drain metal layer SD2 are sequentially stacked, and insulating layers can be provided between the above functional layers. FIG. 4 shows a structure layout of an active layer in FIG. 3, FIG. 5 shows a structure layout of a first conductive layer in FIG. 3, FIG. 6 shows a structure layout of a second conductive layer in FIG. 3, FIG. 7 shows a structure layout of a first source-drain metal layer in FIG. 3, FIG. 8 shows a structure layout of a second source-drain metal layer in FIG. 3, FIG. 9 shows a stacked layout of an active layer and a first conductive layer in FIG. 3, FIG. 10 shows a stacked layout of a second conductive layer and a first source-drain metal layer in FIG. 3, and FIG. 11 shows a stacked layout of an active layer, a first source-drain metal layer, and a second source-drain metal layer in FIG. 3. In some embodiments, the first metal layer can be the first source-drain metal layer SD1, and the second metal layer can be the second source-drain metal layer SD2.

As shown in FIGS. 3 and 4, the active layer Poly can include a first active part POL1 to a seventeenth active part POL17. The first active part POL1 can be used to form a channel region of the first transistor T1, the second active part POL2 can be used to form a channel region of the second transistor T2, the third active part POL3 can be used to form a channel region of the driving transistor T3, and the fourth active part POL4 to the seventh active part POL7 can be used to form channel regions of the fourth transistor T4 to the seventh transistor T7, respectively. The active layer Poly provided in embodiments of the present disclosure can be formed from polycrystalline silicon semiconductor materials, and correspondingly, the transistors in the display panel provided in embodiments of the present disclosure can be P-type low-temperature polycrystalline silicon thin film transistors.

The first active part POL1 to the seventh active part POL7, which serve as the channel regions of the transistors, exhibit semiconductor characteristics. The other area, except for the first active part POL1 to the seventh active part POL7, in the active layer Poly is doped to exhibit conductor characteristics.

As shown in FIG. 4, in some embodiments, both the first transistor T1 and the second transistor T2 can be of the dual-gate structure. In some embodiments, the first active part POL1 can include a first sub active part POL1-1 and a second sub active part POL1-2, and the first sub active part POL1-1 and the second sub active part POL1-2 are respectively used to form the dual channels of the first transistor T1. The first sub active part POL1-1 and the second sub active part POL1-2 can be connected through the eighth active part POL8. The second active part POL2 can include a third sub active part POL2-3 and a fourth sub active part POL2-4 used to form the dual channels of the second transistor T2. The third sub active part POL2-3 and the fourth sub active part POL2-4 can be connected through the eleventh active part POL11.

The ninth active part POL9 is connected between the second sub active part POL1-2 and the fourth sub active part POL2-4, and can be used to form the second electrode of the first transistor T1 and the first electrode of the second transistor T2. The ninth active part POL9 can be connected to a first bridging part 31 in the first source-drain metal layer SD1, so as to connect the second electrode of the first transistor T1 and the first electrode of the second transistor T2 to the gate of the driving transistor T3 through the first bridging part 31.

The tenth active part POL10 is connected to a side of the first sub active part POL1-1. The tenth active part POL10 can be used to form the first electrode of the first transistor T1. The tenth active part POL10 can be connected to a third bridging part 33 in the first source-drain metal layer SD1, so as to connect the first electrode of the first transistor T1 to the first initial signal line Vinit1 through the third bridging part 33.

The twelfth active part POL12 is connected between the second active part POL2, the third active part POL3, and the sixth active part POL6. The twelfth active part POL12 can be used to form the second electrode of the second transistor T2, the first electrode of the sixth transistor T6, and the first electrode of the driving transistor T3.

The thirteenth active part POL13 is connected to a side of the fourth active part POL4 away from the fifth active part POL5. The thirteenth active part POL13 is used to form the second electrode of the fourth transistor T4. The thirteenth active part POL13 can be connected to a data transposition part VdataL in the first source-drain metal layer SD1, so as to connect the second electrode of the fourth transistor T4 to the data signal line Data through the data transposition part VdataL.

The fourteenth active part POL14 is connected between the fourth active part POL4, the fifth active part POL5, and the third active part POL3. The fourteenth active part POL14 can be used to form the second electrode of the driving transistor T3, the first electrode of the fourth transistor T4, and the second electrode of the fifth transistor T5.

The fifteenth active part POL15 is connected to a side of the fifth active part POL5 away from the fourteenth active part POL14. The fifteenth active part POL15 can be used to form the first electrode of the fifth transistor T5. The fifteenth active part POL15 can be connected to a fourth bridging part 34 in the first source-drain metal layer SD1, so as to use the fourth bridging part 34 as a transposition structure, to form electrical connection between the first electrode of the fifth transistor T5 and the first power line VDD.

The sixteenth active part POL16 is connected between the sixth active part POL6 and the seventh active part POL7. The sixteenth active part POL16 can be used to form the second electrode of the sixth transistor T6 and the second electrode of the seventh transistor T7. The sixteenth active part POL16 can be connected to a first electrode transposition part 35 in the first source-drain metal layer SD1, so as to connect the second electrode of the sixth transistor T6 and the second electrode of the seventh transistor T7 to a first electrode of the light-emitting device through the first electrode transposition part 35. The first electrode of the light-emitting device can be, for example, an anode.

The seventeenth active part POL17 is connected to an other side of the seventh active part POL7. The seventeenth active part POL17 can be used to form the first electrode of the seventh transistor T7. The seventeenth active part POL17 can be connected to a second bridging part 32 in the first source-drain metal layer SD1, so as to connect the first electrode of the seventh transistor T7 to the second initial signal line Vinit2 through the second bridging part 32.

As shown in FIGS. 5 and 9, in some embodiments, the first conductive layer Gate1 can include a first conductive block 11. An orthographic projection of the first conductive block 11 on the base substrate can cover an orthographic projection of the third active part POL3 on the base substrate. The first conductive block 11 can be used to form the gate of the driving transistor T3 and the first electrode plate of the storage capacitor Cst.

As shown in FIGS. 5 and 9, in some embodiments, the first conductive layer Gate1 can further include a reset signal line Reset(n), a gate signal line Gate, and an enable signal line EM. Orthographic projections of the reset signal line Reset(n), the gate signal line Gate, and the enable signal line EM on the base substrate can all extend along the first direction X and are distributed at intervals along the second direction Y, and the reset signal line Reset(n) and the gate signal line Gate in the same row are located on the same side of the first conductive block 11, while the enable signal line EM is located on the other side of the first conductive block 11. That is, in the structure layout, the reset signal line Reset(n) and the gate signal line Gate in the same row are located on the same side of the driving transistor T3, and the enable signal line EM is located on the other side of the driving transistor T3.

The reset signal line Reset(n) can be used to provide the reset signal terminal in FIG. 1. In some embodiments, for the reset signal line Reset(n) in a row, an orthographic projection of the reset signal line Reset(n) on the base substrate can cover orthographic projections of the first sub active part POL1-1 and the second sub active part POL1-2 on the base substrate in the same row, as well as an orthographic projection of the seventh active part POL7 on the base substrate in a previous pixel row. Therefore, a section of the reset signal line Reset(n) forms the gate of the first transistor T1, thus forming the double-gate structure of the first transistor T1, and another section of the reset signal line Reset(n) forms the gate of the seventh transistor T7.

In some embodiments, the reset signal line Reset(n) in a row is used to provide the first reset signal terminal Reset(n) in the same row and the second reset signal terminal Reset(n+1) in a previous row. In other words, the first reset signal terminal Reset(n) in FIG. 1 is provided by the reset signal line Reset(n) in the same row, and the second reset signal terminal Reset(n+1) is provided by the reset signal line Reset(n) in the next row. By multiplexing the signal lines, the number of signal lines can be reduced and the layout can be simplified.

The gate signal line Gate can be used to provide the gate signal terminal in FIG. 1. The gate signal line Gate can include a primary extension part Gate0 and a secondary extension part Gate1. An orthographic projection of the primary extension part Gate0 on the base substrate can extend along the first direction X, and an orthographic projection of the secondary extension part Gate1 on the base substrate can extend along the second direction Y. The orthographic projection of the primary extension part Gate0 on the base substrate can cover an orthographic projection of the fourth sub active part POL2-4 on the base substrate, and the orthographic projection of the secondary extension part Gate1 on the base substrate can cover an orthographic projection of the third sub active part POL2-3 on the base substrate. In this way, a section of the gate signal line Gate can form the double-gate structure of the second transistor T2.

In the present disclosure, that a structure A extends along a B direction refers to the fact that A can include a primary section and a secondary section connected to the primary section. The primary section can be a line, a line segment, or a strip-shaped body, and the primary section extends along the B direction, with a length of the primary section extending along the B direction being greater than a length of the secondary section extending in other directions.

The enable signal line EM can be used to provide the enable signal terminal in FIG. 1. An orthographic projection of the enable signal line EM on the base substrate can cover orthographic projections of the fifth active part POL5 and the sixth active part POL6 on the base substrate. A section of the enable signal line EM can be used to form the gate of the fifth transistor T5, and another section of the enable signal line EM can be used to form the gate of the sixth transistor T6.

The display panel provided in embodiments of the present disclosure can use the first conductive layer Gate1 as a mask to conduct conductorization treatment on the active layer Poly. That is, the active layer Poly covered by the first conductive layer Gate1 forms the channel region of the transistor, and the area not covered by the first conductive layer Gate1 forms a conductive structure. It should be understood that in actual products, the gate structure of the transistor is formed by the first conductive layer Gate1, which usually forms overlap arrangement on the active part that is blocked by the structure of the gate of the transistor. That is, in actual products, an orthographic projection of the gate structure of the transistor formed by the first conductive layer Gate1 on the base substrate is slightly larger than an orthographic projection of the active part covered by the gate structure of the transistor on the base substrate. In other words, the orthographic projection of the active part of the transistor on the base substrate is located within the orthographic projection of the corresponding gate structure on the base substrate.

As shown in FIGS. 3 and 6, in some embodiments, the second conductive layer Gate2 can include a second conductive block 22. An orthographic projection of the second conductive block 22 on the base substrate can be located on the orthographic projection of the first conductive block 11 on the base substrate. The second conductive block 22 can be used to form the second electrode plate of the storage capacitor Cst. The second conductive block 22 has a hollow part exposing a partial structure of the first conductive block 11, so that the first conductive block 11 can be connected to the first bridging part 31 in the first source-drain metal layer SD1 through the hollow part, and the gate of the driving transistor T3 can be connected to the second electrode of the first transistor T1 through the first bridging part 31.

As shown in FIG. 6, in some embodiments, the second conductive layer Gate2 can further include a first connection part 232. An orthographic projection of the first connection part 232 on the base substrate can extend along a row direction X. Two adjacent second conductive blocks 22 along the row direction X are connected through the first connection part 232, so that the second conductive blocks 22 in the same row are connected sequentially.

As shown in FIG. 10, in some embodiments, the first connection part 232 can be between adjacent columns of pixels, and connected to a first power transposition line VDDL located in the first source-drain metal layer SD1. The first power transposition line VDDL connects the second conductive block 22 to the first power line VDD in the second source-drain metal layer SD2, thereby connecting the second electrode plate of the storage capacitor Cst to the first power line VDD. The second conductive blocks 22 connected sequentially along the row direction X can provide a grid structure transmission path, which has intertwined rows and columns, for the voltage signal provided by the first power line VDD, which can reduce the RC load of the first power line VDD and thus reduce the power consumption of the display panel.

As shown in FIG. 10, in some embodiments, the second conductive block 22 can be connected to a fourth bridging part 34 in the first source-drain metal layer SD1, so as to connect the second conductive block 22 to the fifteenth active part POL15 through the fourth bridging part 34, thereby connecting the first electrode of the fifth transistor T5 to the first power line VDD through the second conductive block 22 and the first power transposition line VDDL.

As shown in FIG. 6, in some embodiments, the second conductive layer Gate2 can further include a third conductive block 23. The third conductive block 23 can be connected to a constant voltage source. In some embodiments, the third conductive block 23 can be connected to the second conductive block 22, so that the third conductive block 23 can be also connected to the first power line VDD, that is, a constant voltage is provided to the third conductive block 23 through the first power line VDD. In some embodiments, an orthographic projection of the third conductive block 23 on the base substrate can be located on an orthographic projection of the eleventh active part POL11 on the base substrate. That is, the third conductive block 23 is located above the conductorization structure that is connected to the dual channels of the second transistor T2. Therefore, the voltage of the eleventh active part POL11 can be stabilized through the third conductive block 23, thereby reducing the leakage of the second transistor T2, preventing the impact of voltage changes in adjacent column pixel data on the pixel in the present column, reducing the voltage fluctuation of the driving transistor T3 in the pixel driving circuit during the light-emitting stage, and improving the picture quality.

As shown in FIG. 6, in some embodiments, the second conductive layer Gate2 can further include a first initial signal line Vinit1 and a second initial signal line Vinit2. The first initial signal line Vinit1 and the second initial signal line Vinit2 can both extend along the row direction X. The first initial signal line Vinit1 can be used to provide the first initial signal terminal in FIG. 1. The first initial signal line Vinit1 can include a main body part Vinit1-0, a first addition part Vinit1-1, and a second addition part Vinit1-2. An orthographic projection of the main body part Vinit1-0 on the base substrate extends along the row direction. The first addition part Vinit1-1 and the second addition part Vinit1-2 are connected on both sides of the main body part Vinit1-0. The first addition part Vinit1-1 can be connected to the third bridging part 33, so as to connect the first electrode of the first transistor T1 to the first initial signal line Vinit1. As shown in FIGS. 6 and 10, an orthographic projection of the second addition part Vinit1-2 on the base substrate is located between an orthographic projection of the first bridging part 31 on the base substrate and an orthographic projection of corresponding data transposition part VdataL on the base substrate. In this way, the second addition part Vinit1-2 can reduce the interference of changes in data voltage signals on the first bridging part 31, that is, reducing the signal interference of data voltage signals on the first node N1, and improving the display quality.

The second initial signal line Vinit2 can be used to provide the second initial signal terminal in FIG. 1. The second initial signal line Vinit2 can be connected to the second bridging part 32 in the first source-drain metal layer SD1, so as to connect the first electrode of the seventh transistor T7 to the second initial signal line Vinit2 through the second bridging part 32.

As shown in FIG. 7, in some embodiments, the first source-drain metal layer SD1 can further include a first power transposition line VDDL. An orthographic projection of the first power transposition line VDDL on the base substrate can extend along the column direction Y. The first power transposition line VDDL can be located between two adjacent sub pixels along the row direction X. In one aspect, the first power transposition line VDDL can be connected to the first connection part 232 in the second conductive layer Gate2, so as to be connected to the second conductive block 22. In another aspect, the first power transposition line VDDL can also be connected to the first power line VDD in the second source-drain metal layer SD2 through via holes. In this way, the second electrode plate of the storage capacitor Cst and the first electrode of the fifth transistor T5 can be connected to the first power line VDD. The first power transposition line VDDL forms a parallel structure of the first power line VDD, which, on the one hand, can reduce the line resistance of the first power line VDD and thus reduce the voltage drop loss on the first power line VDD. On the other hand, when the first power line VDD breaks, a path can be formed through the first power transposition line VDDL, which can avoid the situation where the pixel driving circuit cannot work properly due to the breakage of the first power line VDD and improve the reliability of the display panel.

As shown in FIG. 7, in some embodiments, the first source-drain metal layer SD1 can further include a first bridging part 31 to a fourth bridging part 34. The first bridging part 31, the second bridging part 32, and the fourth bridging part 34 can all extend along the column direction Y, and the third bridging part 33 can extend along the row direction X. One end of the first bridging part 31 can be connected to the first conductive block 11, and the other end of the first bridging part 31 can be connected to the ninth active part POL9, so as to connect the second electrode of the first transistor T1 and the first electrode of the second transistor T2 to the gate of the driving transistor T3.

One end of the second bridging part 32 can be connected to the seventeenth active part POL17, so as to be connected to the first electrode of the seventh transistor T7, and the other end of the second bridging part 32 can be connected to the second initial signal line Vinit2, so as to connect the first electrode of the seventh transistor T7 to the second initial signal line Vinit2.

One end of the third bridging part 33 can be connected to the tenth active part POL10, so as to be connected to the first electrode of the first transistor T1, and the other end of the third bridging part 33 can be connected to the first initial signal line Vinit1, so as to connect the first electrode of the first transistor T1 to the first initial signal line Vinit1 through the third bridging part 33.

One end of the fourth bridging part 34 can be connected to the second conductive block 22, and the other end of the fourth bridging part 34 can be connected to the fifteenth active part POL15, so as to connect the first electrode of the fifth transistor T5 to the first power line VDD through the transposition by the second conductive block 22.

As shown in FIG. 7, in some embodiments, the first source-drain metal layer SD1 can further include a data transposition part VdataL. The data transposition part VdataL can be connected to the thirteenth active part POL13, so as to be connected to the data signal line Data in the second source-drain metal layer SD2 through the data transposition part VdataL, and connect the second electrode of the fourth transistor T4 to the data signal line Data.

As shown in FIG. 7, in some embodiments, the first source-drain metal layer SD1 can further include a first electrode transposition part 35. The first electrode transposition part 35 can be connected to the sixteenth active part POL16 and a second electrode transposition part 42, so as to connect the second electrode of the sixth transistor T6 and the second electrode of the seventh transistor T7 to the first electrode of the light-emitting device through the second electrode transposition part 42. The first electrode of the light-emitting device can be, for example, an anode.

As shown in FIG. 7, in some embodiments, the first source-drain metal layer SD1 can further include multiple fan-out transposition lines FIP-H. The fan-out transposition lines FIP-H can extend along the row direction X and be located between two adjacent rows of sub pixels. The present disclosure allows some data signal lines Data near the side areas of the panel to be trans positioned to the middle area of the panel through the fan-out transposition lines FIP-H extending along the row direction, and then to be leaded out from the lower border of the panel through the data fan-out lines FIP-V extending along the column direction in the middle area of the panel, thereby reducing the size of the lower border of the display panel. The specific transposition ways in the display panel by using the fan-out transposition lines FIP-H can be found in the subsequent embodiments, which will not be elaborated here.

As shown in FIGS. 3, 8, and 11, in some embodiments, the second source-drain metal layer SD2 can include a first power line VDD. An orthographic projection of the first power line VDD on the base substrate can extend along the column direction Y. The first power line VDD can be used to provide the first power supply terminal in FIG. 1. The first power line VDD can be connected to the first power transposition line VDDL in the first source-drain metal layer SD1 to connect the second electrode of the storage capacitor Cst to the first electrode of the fifth transistor T5 through the first power transposition line VDDL.

As shown in FIG. 8, in some embodiments, the second source-drain metal layer SD2 can further include a second electrode transposition part 42. The second electrode transposition part 42 can be connected to the first electrode transposition part 35 in the first source-drain metal layer SD1 and the first electrode of the light-emitting device, so as to connect the second electrode of the sixth transistor T6 and the second electrode of the seventh transistor T7 to the first electrode of the light-emitting device. The first electrode of the light-emitting device can be, for example, an anode.

As shown in FIG. 8, in some embodiments, the second source-drain metal layer SD2 can further include a data signal line Data. The data signal line Data can be used to provide the data signal terminal in FIG. 1. In some embodiments, as shown in FIG. 11, one column of pixels can be provided with two data signal lines Data correspondingly, and the two data signal lines Data can be arranged on both sides of the column of pixels. In some embodiments, the data signal line Data can include a first data signal line DT1 and a second data signal line DT2. The display panel can include multiple first pixel driving circuits and multiple second pixel driving circuits distributed at intervals along the column direction. The first data signal line DT1 can be connected to the thirteenth active part POL13 in the first pixel driving circuit on the left side of a column of pixels, and the second data signal line DT2 can be connected to the thirteenth active part POL13 in the second pixel driving circuit on the right side of the column of pixels. By arranging dual data signal lines Data, an odd row and an even row can be driven separately. In some embodiments, in the same one column of pixels, the first data signal line DT1 provides data signals to the first pixel driving circuits in odd rows, and the second data signal line DT2 provides data signals to the second pixel driving circuits in even rows, which can effectively increase the compensation time and improve the display quality under high-frequency driving, achieving high refresh rate while improving the display quality. In some embodiments, the odd and even rows is scanned alternately, and the data writing time of a first row and a second row through the first data signal line DT1 and the second data signal line DT2 can partially overlap, as long as the data writing time of the first row does not affect the data writing of the third row. In this way, the data writing time of the first row can be increased, thereby fully compensating for the threshold voltage of the driving transistor T3 in the pixel driving circuit of the first row. The data writing time of other rows can also be increased, so that the threshold voltage of the driving transistor T3 in each row can be fully compensated, thereby improving the display quality while high-frequency driving.

In the related art, the dual data signal lines Data will increase the number of the lines leaded out on the lower border of the panel, making it impossible to achieve an extremely narrow lower border. According to embodiments of the present disclosure, by arranging multiple data fan-out lines FIP-V in the second source-drain metal layer SD2, as well as co-arrangement of the data fan-out lines FIP-V and the fan-out transposition lines FIP-H, an extremely narrow lower border under the architecture of dual data signal lines can be achieved. As shown in FIG. 8, in some embodiments, the second source-drain metal layer SD2 can further include multiple data fan-out lines FIP-V. The data fan-out lines FIP-V can extend along the column direction. The data fan-out lines FIP-V can be connected to the fan-out transposition lines FIP-H in the first source-drain metal layer SD1 through via holes, so that the data signal lines Data near the side areas of the display panel can be trans positioned to and leaded out from the middle area of the panel, thereby achieving an extremely narrow lower border.

Figure 12:
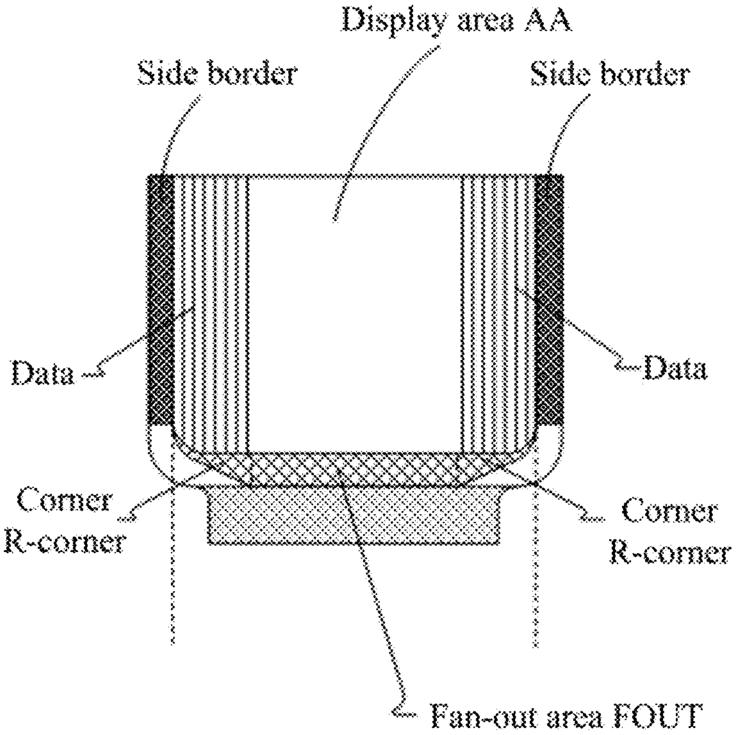
FIG. 12 is a schematic diagram of a leading-out structure of a display panel on a lower border according to embodiments of the present disclosure.

In some embodiments, FIG. 12 is a schematic diagram of a leading-out structure of a display panel on a lower border according to embodiments of the present disclosure. As shown in FIG. 12, the display panel includes side areas that are relatively arranged along the row direction and a fan-out area FOUT located on a side of the display area in the column direction. The fan-out area FOUT has corners R-corner that are connected to the side areas. Extension lines of the $1^{st}$ to the $n^{th}$ data signal lines Data close to any side area pass through the corner R-corner on the corresponding side. That is, in the conventional leading-out schemes, the $1^{st}$ to the $n^{th}$ data signal lines Data close to any side area are directly leaded out form the display area and enter the fan-out area FOUT at the corresponding position, which will inevitably increase the diagonal height of the wiring drawn from the left and right sides of the fan-out area FOUT towards the middle of the panel, thereby increasing the width of the lower border. It should be noted that the $1^{st}$ to the $n^{th}$ data signal lines Data described here are mentioned for one of the side areas. In some embodiments, in FIG. 12, for the left side area, the $1^{st}$ data signal line Data refers to the data signal line Data closest to the left side area, and then the data signal lines along the direction away from the left side area, are sequentially referred to as the $2^{nd}$ data signal line, the $3^{rd}$ data signal line, . . . , and the $n^{th}$ data signal line. Similarly, for the right side area, the $1^{st}$ data signal line Data refers to the data signal line Data closest to the right side area, and then the data signal lines along the direction away from the right side area, are sequentially referred to as the $2^{nd}$ data signal line, . . . , and the $n^{th}$ data signal line.

As shown in FIG. 11, orthographic projections of the data fan-out lines FIP-V on the base substrate can be located on orthographic projections of the semiconductor units ACT0 on the base substrate in the same column of pixels. That is, the data fan-out lines FIP-V passes through the middle of a column of pixels. In other words, without changing the pixel size, the data signal line Data in the side areas of the panel can be transferred to be leaded out from the middle area of the panel by adding the data fan-out lines FIP-V extending along the column direction in the second source-drain metal layer SD2.

In some embodiments, the first data signal line DT1 located in the $1^{st}$ pixel column can be connected to the $k^{th}$ fan-out transposition line FIP-H, and the $k^{th}$ fan-out transposition line FIP-H can also be connected to the data fan-out line FIP-V located in the $m^{th}$ pixel column. The second data signal line DT2 located in the $1^{st}$ pixel column can be connected to the $(k+1)^{th}$ fan-out transposition line FIP-H. The $(k+1)^{th}$ fan-out transposition line FIP-H can be located below the $k^{th}$ fan-out transposition line FIP-H along the column direction, and the $(k+1)^{th}$ fan-out transposition line FIP-H can also be connected to the data fan-out line FIP-V located in the $(m-1)^{th}$ pixel column. The first data signal line DT1 located in the $n^{th}$ pixel column can be connected to the $(k+2n-2)^{th}$ fan-out transposition line FIP-H, and the $(k+2n-2)^{th}$ fan-out transposition line FIP-H can also be connected to the data fan-out line FIP-V located in the $(m-2n+2)^{th}$ pixel column. The second data signal line DT2 located in the $n^{th}$ pixel column can be connected to the $(k+2n-1)^{th}$ fan-out transposition line FIP-H, and the $(k+2n-1)^{th}$ fan-out transposition line FIP-H can also be connected to the data fan-out line FIP-V located in the $(m-2n+1)^{th}$ pixel column, where n is a natural number greater than 1, m is greater than $3n-1$ and less than $N-n$, N is the total number of pixel columns in the display panel, and k is a natural number.

In some embodiments, $m+1$ is greater than $3n$, indicating that the present disclosure intends to transfer all the data signal lines Data that are leaded out from the corner R-corner in the conventional scheme to be leaded out from the middle area of the panel.

In some embodiments, taking $k=5$, $m=90$, $n=30$ as an example, in the conventional scheme, the data signal lines located in the $1^{st}$ pixel column to the $30^{th}$ pixel column are leaded out from the corner R-corner of the fan-out area FOUT. In some embodiments, the first data signal line DT1 located in the $1^{st}$ pixel column is connected to the $5^{th}$ fan-out transposition line FIP-H, and the $5^{th}$ fan-out transposition line FIP-H is then connected to the data fan-out line FIP-V1 located in the $90^{th}$ pixel column, thereby transferring the first data signal line DT1 located in the $1^{st}$ pixel column to be leaded out from the $90^{th}$ pixel column. The second data signal line DT2 located in the $1^{st}$ pixel column is connected to the $6^{th}$ fan-out transposition line FIP-H, and the $6^{th}$ fan-out transposition line FIP-H is then connected to the data fan-out line FIP-V2 located in the $89^{th}$ pixel column, thereby transferring the second data signal line DT2 located in the $1^{st}$ pixel column to be leaded out from the $89^{th}$ pixel column. Similarly, the first data signal line DT1 located in the $30^{th}$ pixel column is connected to the data fan-out line FIP-V located in the $32^{nd}$ pixel column through the $63^{rd}$ fan-out transposition line FIP-H, thereby transferring the first data signal line DT1 located in the $30^{th}$ pixel column to be leaded out from the $32^{nd}$ pixel column of the panel. The second data signal line DT2 located in the $30^{th}$ pixel column is connected to the data fan-out line FIP-V located in the $31^{st}$ pixel column through the $64^{th}$ fan-out transposition line FIP-H, thereby transferring the second data signal line DT2 located in the $30^{th}$ pixel column to be leaded out from the $31^{st}$ pixel column of the panel. In this way, the data signal lines Data located in the $1^{st}$ pixel column to the $30^{th}$ pixel column can be transferred to the $31^{st}$ pixel column to the $90^{th}$ pixel column of the panel, and leaded out from the $31^{st}$-$90^{th}$ pixel columns. Such leading-out way can reduce the diagonal height of the wiring drawn from the left and right sides of the fan-out area FOUT towards the middle of the panel, thereby reducing the size of the lower border.

In some embodiments, the data signal lines can also be leaded out in ascending order. In some embodiments, the first data signal line DT1 located in the $1^{st}$ pixel column can be connected to the $k^{th}$ fan-out transposition line FIP-H, and the $k^{th}$ fan-out transposition line FIP-H can also be connected to the data fan-out line FIP-V located in the $m^{th}$ pixel column. The second data signal line DT2 located in the $1^{st}$ pixel column can be connected to the $(k+1)^{th}$ fan-out transposition line FIP-H, and the $(k+1)^{th}$ fan-out transposition line FIP-H can also be connected to the data fan-out line FIP-V located in the $(m+1)^{th}$ pixel column. The first data signal line DT1 located in the $n^{th}$ pixel column can be connected to the $(k+2n-2)^{th}$ fan-out transposition line FIP-H, and the $(k+2n-2)^{th}$ fan-out transposition line FIP-H can also be connected to the data fan-out line FIP-V located in the $(m+2n-2)^{th}$ pixel column. The second data signal line DT2 located in the $n^{th}$ pixel column can be connected to the $(k+2n-1)^{th}$ fan-out transposition line FIP-H, and the $(k+2n-1)^{th}$ fan-out transposition line FIP-H can also be connected to the data fan-out line FIP-V located in the $(m+2n-1)^{th}$ pixel column, where n is a natural number greater than 1, m is a natural number greater than n and less than $N-3n+1$, N is the total number of pixel columns in the display panel, and k is a natural number.

Taking k=5, m=90, n=30 as an example, the first data signal line DT1 located in the $1^{st}$ pixel column is connected to the $5^{th}$ fan-out transposition line FIP-H, and the $5^{th}$ fan-out transposition line FIP-H is then connected to the data fan-out line FIP-V1 located in the $90^{th}$ pixel column, thereby transferring the first data signal line DT1 located in the $1^{st}$ pixel column to the $90^{th}$ pixel column, to be leaded out there. The second data signal line DT2 located in the $1^{st}$ pixel column is connected to the $6^{th}$ fan-out transposition line FIP-H, and the $6^{th}$ fan-out transposition line FIP-H is then connected to the data fan-out line FIP-V2 located in the $91^{st}$ pixel column, thereby transferring the second data signal line DT2 located in the $1^{st}$ pixel column to the $91^{st}$ pixel column, to be leaded out there. Similarly, the first data signal line DT1 located in the $30^{th}$ pixel column is connected to the data fan-out line FIP-V30 located in the $148^{th}$ pixel column through the $63^{rd}$ fan-out transposition line FIP-H, thereby transferring the first data signal line DT1 located in the $30^{th}$ pixel column to the $148^{th}$ pixel column of the panel, to be leaded out there. The second data signal line DT2 located in the $30^{th}$ pixel column is connected to the data fan-out line FIP-V29 located in the $149^{th}$ pixel column through the $64^{th}$ fan-out transposition line FIP-H, thereby transferring the second data signal line DT2 located in the $30^{th}$ pixel column to the $149^{th}$ pixel column of the panel, to be leaded out there. It can be seen that the data signal lines that are directly leaded out from the corner R-corner as in the conventional scheme, can also be transferred to be leaded out from the middle area of the panel using the method in the ascending manner, thereby reducing the size of the lower border.

As shown in FIG. 8, in some embodiments, the second source-drain metal layer SD2 can further include multiple second power transposition lines SIP. Orthographic projections of the multiple second power transposition lines SIP on the base substrate can extend along the column direction and are distributed at intervals along the row direction. The orthographic projection of the second power transposition line SIP on the base substrate is located on the orthographic projection of the semiconductor unit ACT0 on the base substrate located in the corresponding pixel column. In some embodiments, the second power transposition lines SIP pass through the middle of the corresponding pixel columns. In some embodiments, some of the second power transposition lines SIP and the data fan-out lines FIP-V are located in the same pixel columns, some of the second power transposition lines SIP and the data fan-out lines FIP-V are located in different pixel columns, and the data fan-out lines FIP-V and the second power transposition lines SIP in the same pixel column are not connected to each other. The second power transposition lines SIP are connected to the second power line VSS in the non-display area of the display panel. The second power line VSS is used to provide the second power supply terminal. In some embodiments, some of the second power transposition lines SIP and the data fan-out lines FIP-V are located in the same columns, because the data fan-out lines FIP-V are leaded out from the lower border of the panel, while some of the data fan-out lines FIP-V do not need to extend to the upper border of the panel. For example, the data fan-out line FIP-V can start extending from the $10^{th}$ row, towards the lower border and be leaded out from the lower border. For such column, the second power transposition lines SIP will also be arranged between the $1^{st}$ to the $9^{th}$ rows, so that some of the second power transposition lines SIP and the data fan-out lines FIP-V are located in the same columns. The data fan-out line FIP-V and the second power transposition line SIP located in the same column are not connected to each other. This can be understood that the addition lines added to the second source-drain metal layer SD2 include two line segments, one of the line segments is used to be connected to the fan-out transposition lines FIP-H, and the other line segment is used to be connected to the second power line VSS. In some embodiments, some of the second power transposition lines SIP and the data fan-out lines FIP-V are located in different columns. Under such case, the second power transposition lines SIP will also be arranged for the pixel columns without the data fan-out lines FIP-V. In this way, the metal wiring of the second source-drain metal layer SD2 can be more uniform, ensuring consistent parasitic effects within each sub-pixel and improving the uniformity of the display panel. Further, the second power transposition lines SIP can effectively reduce the resistance of the second power line VSS, which is conducive to reducing the overall power consumption of the panel and improving the display quality.

As shown in FIG. 11, in some embodiments, both orthographic projections of the data fan-out line FIP-V and the second power transposition line SIP on the base substrate do not overlap with the orthographic projection of the first bridging part 31 on the base substrate. The first bridging part 31 is connected to the gate of the driving transistor T3 to form the first node N1 in FIG. 1, which is equivalent to the fact that both the data fan-out line FIP-V and the second power transposition line SIP avoid the first node N1 from the above of the first node N1, thereby reducing the signal interference to the first node N1 and improving the display quality. In some embodiments, taking that the data fan-out line FIP-V avoids the first node N1 as an example, the data fan-out line FIP-V can include a first section part FIP-V11, a second section part FIP-V12, and a third section part FIP-V13. The first section part FIP-V11 can be located close to the first data signal line DT1, the third section part FIP-V13 can be located close to the second data signal line DT2, and the first section part FIP-V11 extends to a position between the first bridging part 31 and the first electrode transposition part 35 and is connected to the second section part FIP-V12 there. The second section part FIP-V12 has an angle with the first section part FIP-V11. That is, the data fan-out line FIP-V is shift to an offset position, which is equivalent to a fact that the data fan-out line FIP-V is bent between the first bridging part 31 and the first electrode transposition part 35 before extending along the column direction again. In this way, the data fan-out line FIP-V avoids the first electrode transposition part 35 and the first bridging part 31 below at the same time. The data fan-out line FIP-V is bent in the way described above at each pixel driving circuit it passes through, so that the first node N1 and the first electrode transposition part 35 in each pixel driving circuit can be avoided.

In some embodiments, the orthographic projection of the data fan-out line FIP-V on the base substrate can also partially overlap with the orthographic projection of the first bridging part 31 on the base substrate, and a ratio of an overlapping area to the area of the orthographic projection of the first bridging part 31 on the base substrate can be less than or equal to 10%, such as 1%, 5%, 7%, 8%, 10%, etc. That is, when the data fan-out line FIP-V overlaps with the first bridging part 31 below, it is necessary to ensure that the overlapping area is small to fully reduce the signal interference to the first node N1.

It should be understood that in the present disclosure, a shape of the second power transposition line SIP is provided to be the same as a shape of the data fan-out line FIP-V, so that the process can be simplified and the consistent parasitic effects between each sub-pixel can be ensured, which is also conducive to improving the display quality.

As shown in FIGS. 8 and 11, in some embodiments, the shapes of the second power transposition line SIP in the same column can be different at different row positions, or the shapes of the data fan-out line FIP-V in the same column can be different at different row positions. The shapes of the second power transposition lines SIP in different columns can be different at the same row position, and the shapes of the data fan-out lines FIP-V in different columns can be different at the same row position.

In some embodiments, in FIG. 8, the shapes of the second power transposition line SIP in the first column are different at two row positions shown in the figure, and the shapes of the data fan-out line FIP-V in the second column are different at two row positions shown in the figure. Specifically, in the first pixel column, the first data signal line DT1 is connected to the fan-out transposition line FIP-H in the first source-drain metal layer SD1 through the section part extending along the row direction. That is, the first data signal line DT1 located on the left side of the first column is trans positioned to the fan-out transposition line FIP-H in the middle of the first column through the section part extending along the row direction. Similarly, the second data signal line DT2 in the first column is connected to the fan-out transposition line FIP-H at a corresponding position through the section part extending along the row direction, thereby trans positioning the second data signal line DT2 located on the right side of the first column to the fan-out transposition line FIP-H in the middle of the first column. In this way, the second power transposition line SIP in the first column needs to avoid the section parts extending along the row direction at these two row positions. However, the first data signal line DT1 and the second data signal line DT2 in the second column are not connected to the fan-out transposition line FIP-H at these two row positions, and thus the second power transposition line SIP in the second column does not need to avoid at these two row positions, resulting in different shapes of the second power transposition lines SIP in the first column and the second power transposition line SIP in the second column at these two row positions. It should be understood that in the same column, the shapes of the second power transposition line SIP and the shapes of the data fan-out line FIP-V will be different at the position where the fan-out transposition line FIP-H is connected and at the position where the fan-out transposition line FIP-H is not connected due to the above reasons, which will not be repeated here.

In some embodiments, the first data signal line DT1 and the second data signal line DT2 are each connected to the fan-out transposition line FIP-H through the section parts extending along the row direction, so as to avoid the first electrode transposition part 35 in the same row. Taking the first data signal line DT1 as an example, if the first data signal line DT1 is directly connected to the fan-out transposition line FIP-H below through a via hole, it is necessary to increase the metal area of the first data signal line DT1 at the via hole position. However, increasing the area will cause the distance between the first data signal line DT1 and the first electrode transposition part 35 to be too close. Therefore, the section part extending along the row direction is provided, so as to be connected to the fan-out transposition line FIP-H below through the via hole, and the first electrode transposition part 35 can be avoided. Similarly, the second data signal line DT2 is connected to the fan-out transposition line FIP-H below through the section part extending along the row direction by means of the via hole, so as to avoid the first electrode transposition 35 in the same row.

In some embodiments, it should be noted that, as shown in FIG. 7, the fan-out transposition line FIP-H is provided to be bent, so as to avoid the fourth bridging part 34 in the same row. In this way, there will be sufficient space between the fan-out transposition line FIP-H and the fourth bridging part 34, avoiding the interference between the two.

In some embodiments, as shown in FIGS. 4 to 11, the display panel provided in embodiments of the present disclosure can include multiple repeating units. One repeating unit can include two rows, four columns, and eight pixel driving circuits. Within the same repeating unit, for the same row, the left two pixel driving circuits can be approximately symmetrical to the right two pixel driving circuits. The structures of the left two pixel driving circuits are approximately the same, and the structures of the right two pixel driving circuits are also approximately the same, forming an "AABB" formed structure in the first row. Within the same repeating unit, the structures of the left two pixel driving circuits in the previous row and the structures of the right two pixel driving circuits in the next row are roughly the same, and the structures of the right two pixel driving circuits in the previous row and the structures of the left two pixel driving circuits in the next row are also roughly the same, forming a "BBAA" formed structure in the second row. The structures of the two pixel driving circuits described here are roughly the same rather than completely the same, because some metal layers have different structures in different pixel circuits. For example, as described in the above, for each pixel driving circuit, the shapes of the second power transposition line SIP and the shapes of the data fan-out line FIP-V in the second source-drain metal layer SD2 are not completely the same at some rows.

In some embodiments of the present disclosure, two data fan-out lines FIP-V can be inserted into a pixel column, allowing for more sub-pixel space to arrange the second power transposition line SIP. Further explanations of the solutions will be provided in the following with reference to the drawings.

Figure 13:
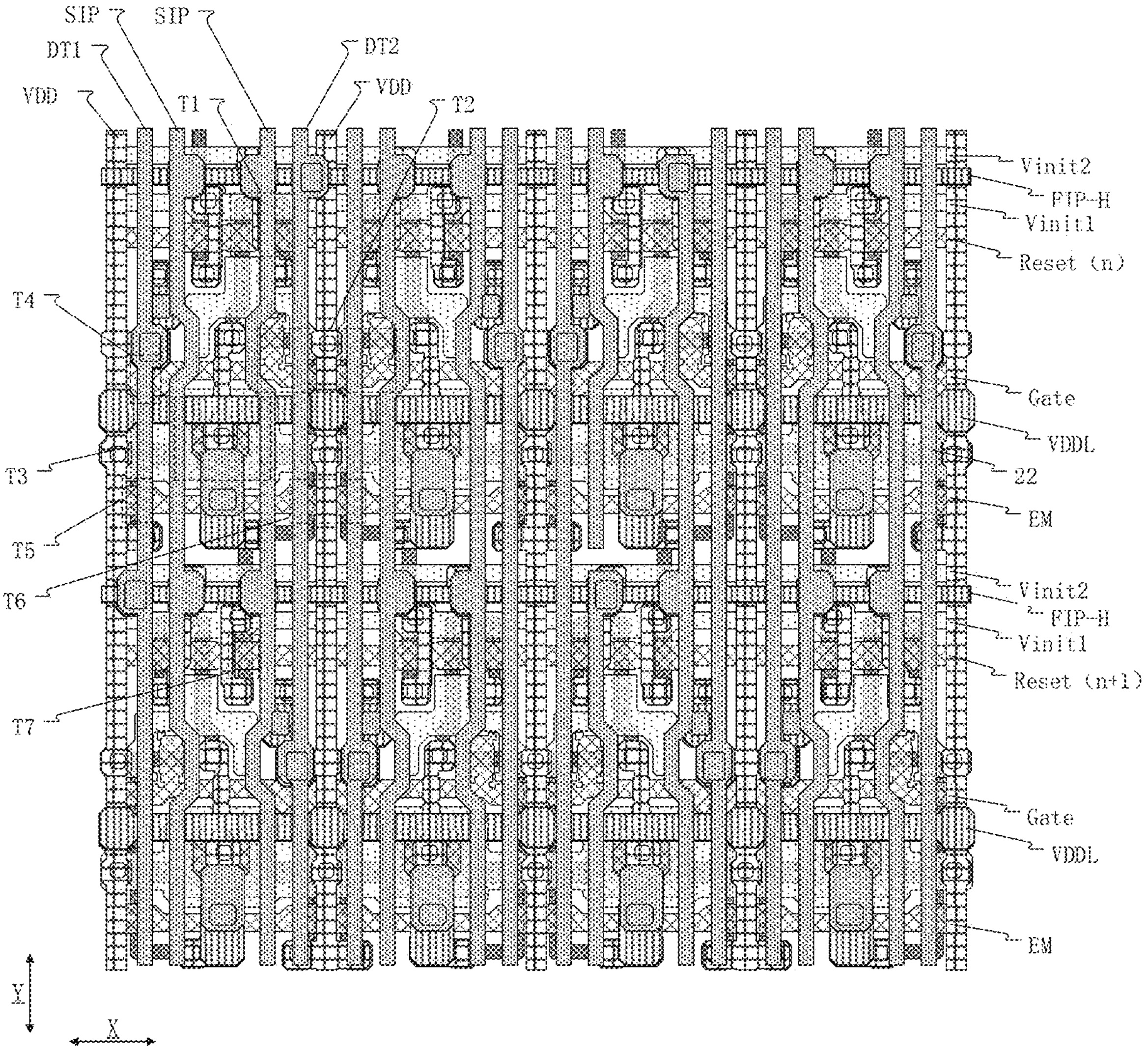
FIG. 13 is a structure layout of a display panel according to embodiments of the present disclosure.
Figure 14:
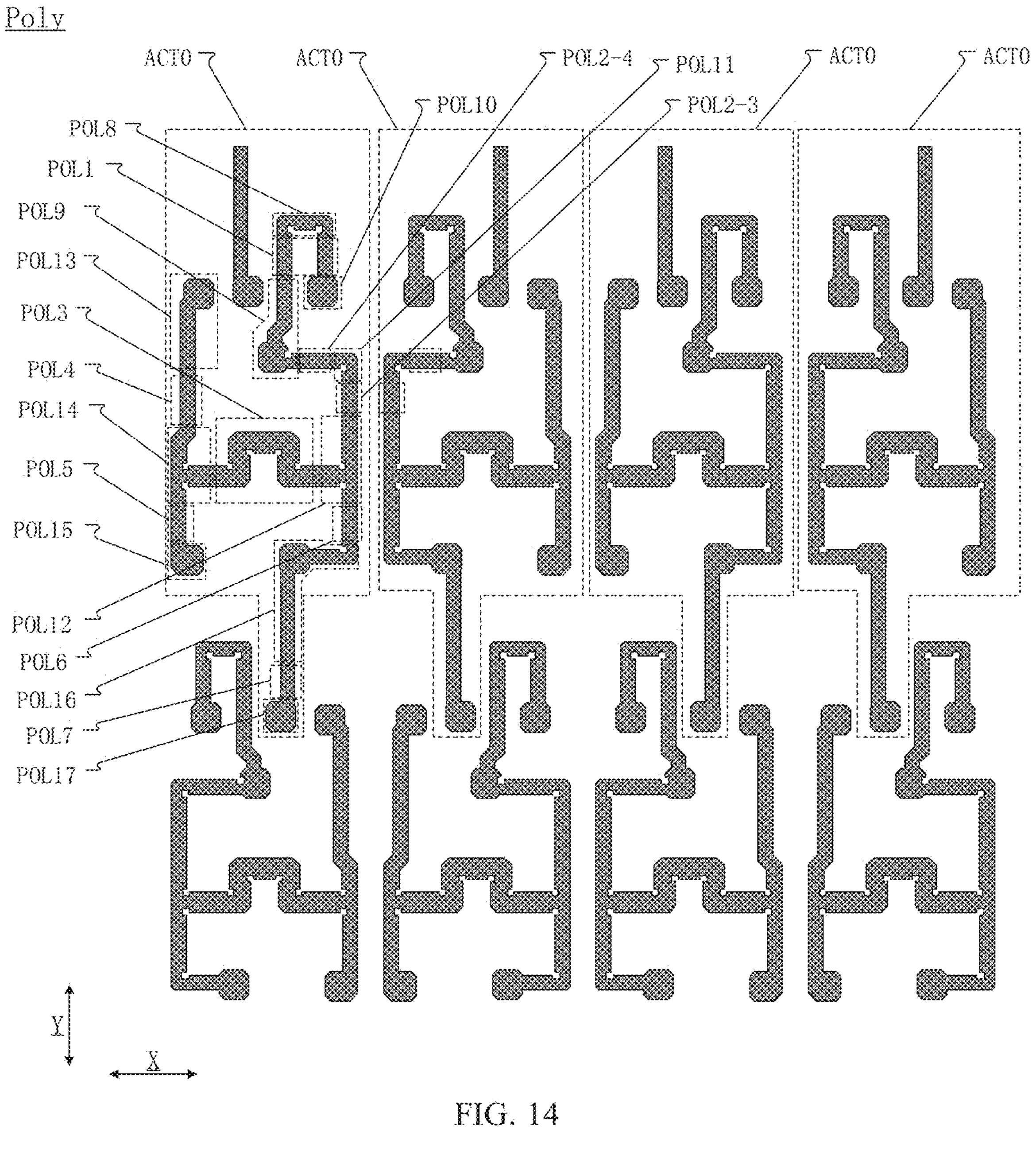
FIG. 14 is a structure layout of an active layer in FIG. 13.
Figure 15:
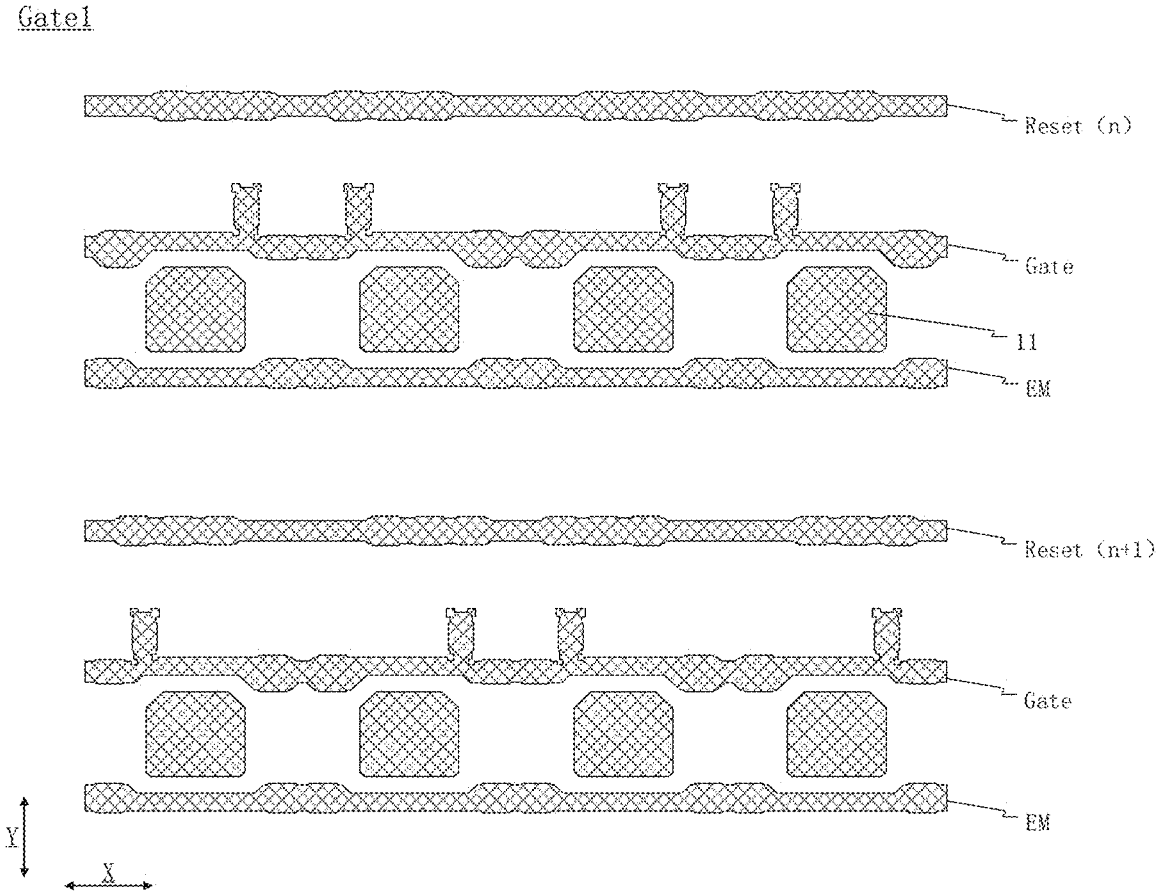
FIG. 15 is a structure layout of a first conductive layer in FIG. 13.
Figure 16:
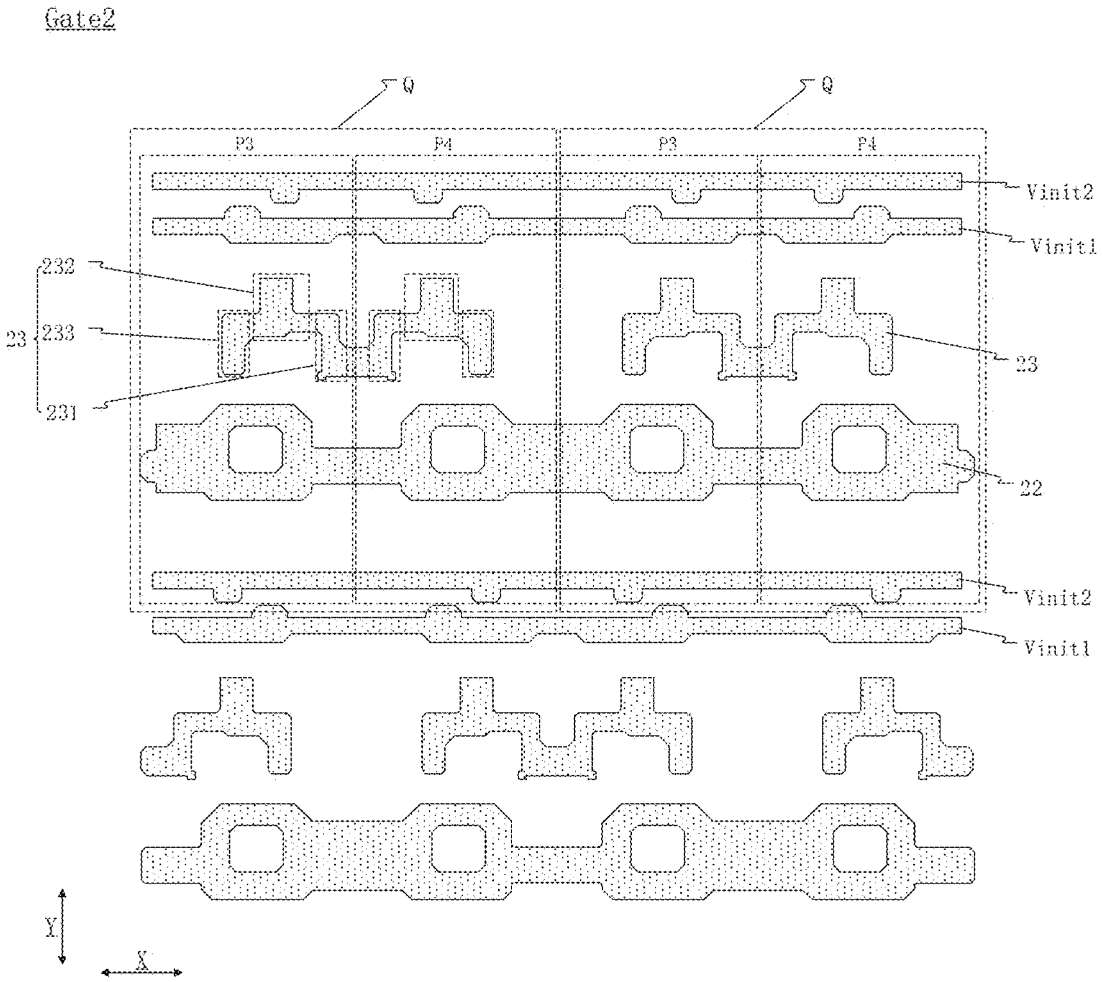
FIG. 16 is a structure layout of a second conductive layer in FIG. 13.
Figure 17:
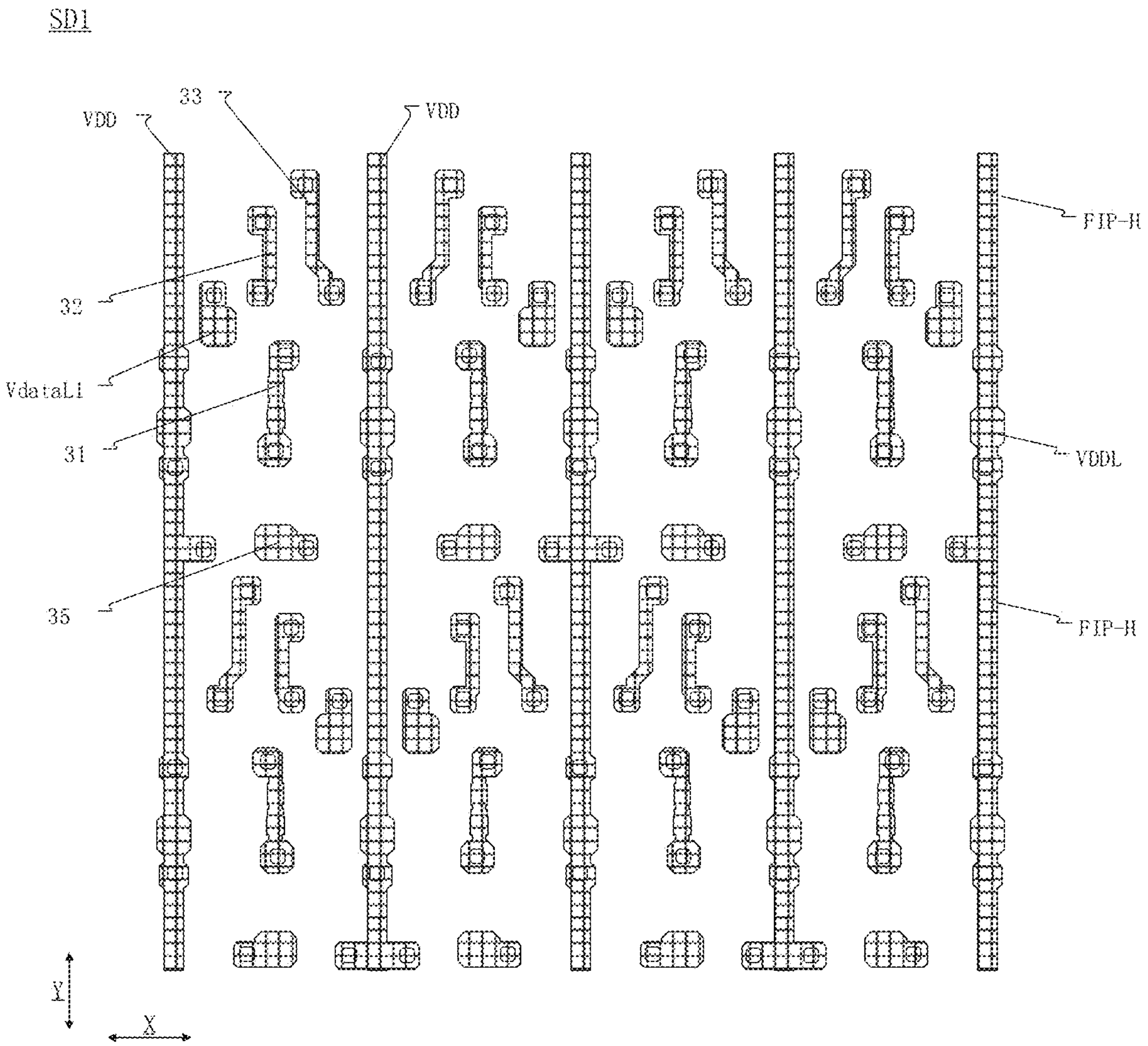
FIG. 17 is a structure layout of a first source-drain metal layer in FIG. 13.
Figure 18:
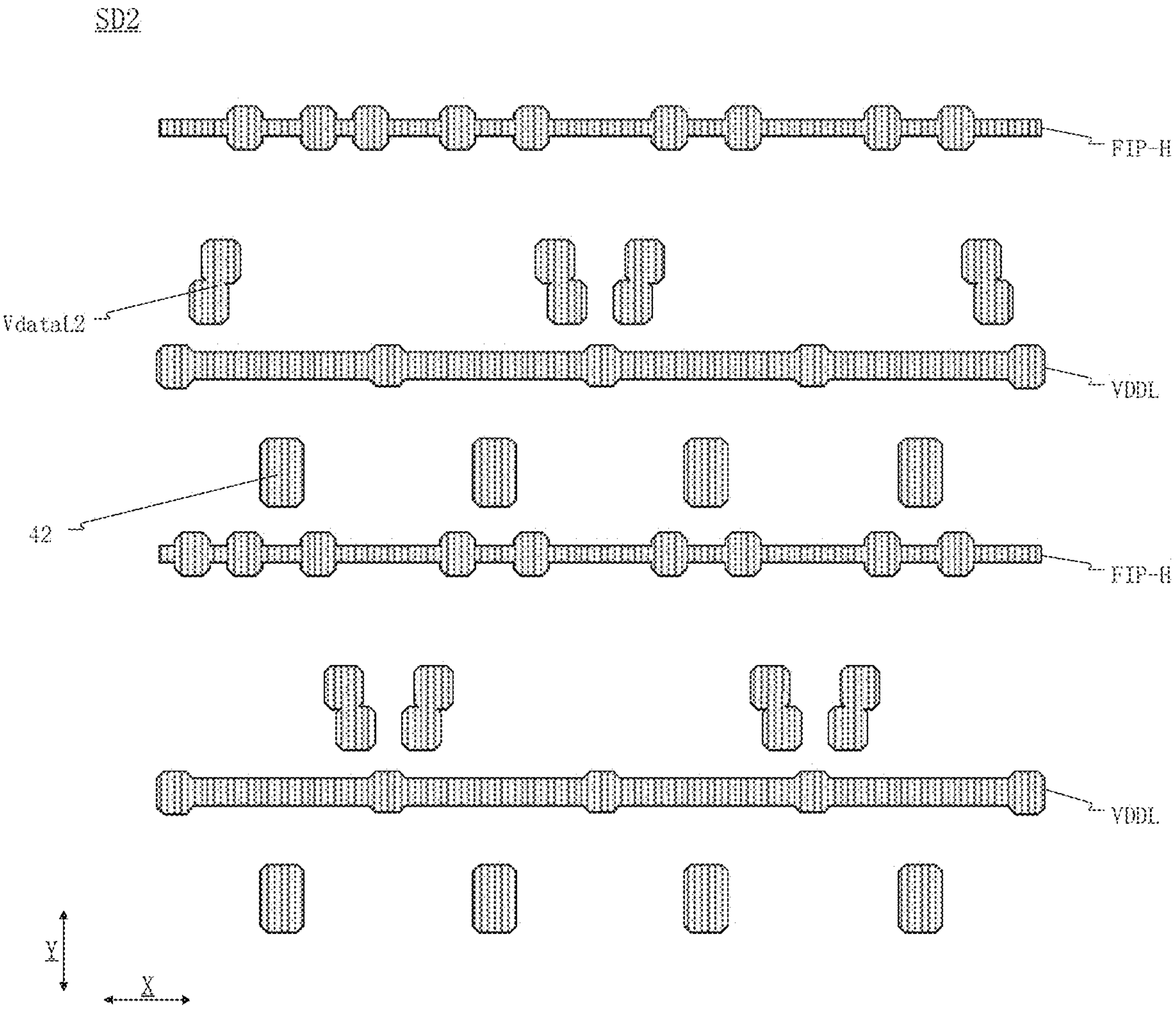
FIG. 18 is a structure layout of a second source-drain metal layer in FIG. 13.
Figure 19:
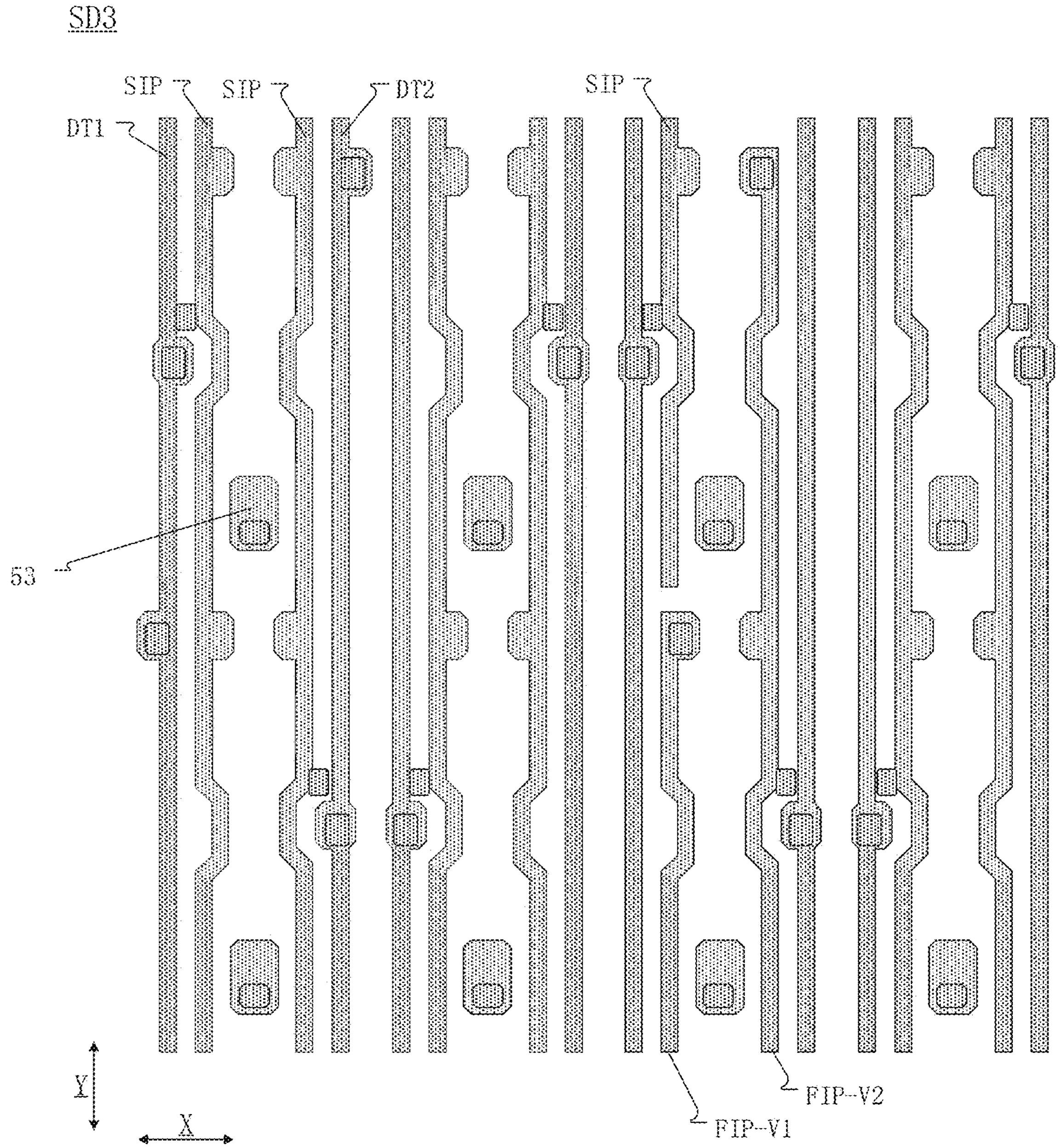
FIG. 19 is a structure layout of a third source-drain metal layer in FIG. 13.
Figure 20:
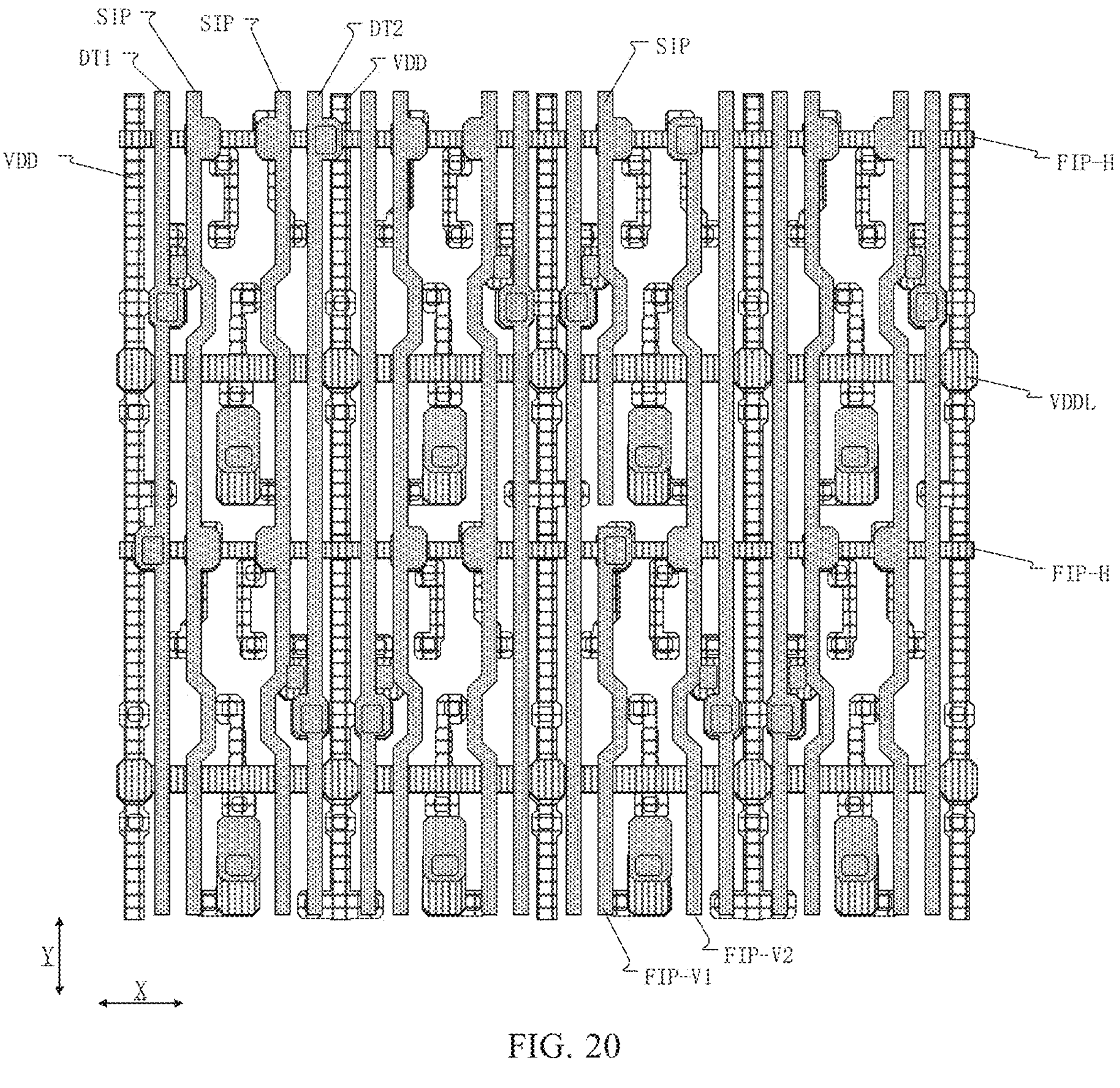
FIG. 20 is a stacked layout of a first source-drain metal layer, a second source-drain metal layer, and a third source-drain metal layer in FIG. 13.

Based on the above embodiments, FIG. 13 shows a structure layout of a display panel according to embodiments of the present disclosure, FIG. 14 shows a structure layout of an active layer in FIG. 13, FIG. 15 shows a structure layout of a first conductive layer in FIG. 13, FIG. 16 shows a structure layout of a second conductive layer in FIG. 13, FIG. 17 shows a structure layout of a first source-drain metal layer in FIG. 13, FIG. 18 shows a structure layout of a second source-drain metal layer in FIG. 13, FIG. 19 shows a structure layout of a third source-drain metal layer in FIG. 13, and FIG. 20 shows a stacked layout of a first source-drain metal layer, a second source-drain metal layer, and a third source-drain metal layer in FIG. 13. In some embodiments, the first metal layer can be the second source-drain metal layer SD2, and the second metal layer can be the third source-drain metal layer SD3.

As shown in FIGS. 13 to 15, in some embodiments, the active layer Poly and the first conductive layer Gate1 can include all the structural features corresponding to the active layer Poly and the first conductive layer Gate1 in FIG. 3, which will not be repeated here.

As shown in FIG. 16, in some embodiments, likewise, the second conductive layer Gate2 can include a second conductive block 22 and a third conductive block 23, which differs from the layout structure shown in FIG. 3 in that, the second conductive block 22 and the third conductive block 23 are not connected, and the second conductive block 22 and the third conductive block 23 can be directly connected to the first power line VDD, respectively. In some embodiments, the display panel can include multiple repeating units Q. The repeating units Q can include third pixel driving circuits P3 and fourth pixel driving circuits P4 arranged adjacent to each other along the row direction. In the same repeating unit Q, the structures of the active layer, the first conductive layer, the second conductive layer, the first source-drain metal layer, and the second source-drain metal layer in the third pixel driving circuit P3 correspondingly form mirror images of the structures of the active layer, the first conductive layer, the second conductive layer, the first source-drain metal layer, and the second source-drain metal layer in the fourth pixel driving circuit P4. In any two adjacent repeating units Q along the row direction, the structures of the active layer, first conductive layer, second conductive layer, first source-drain metal layer, and second source-drain metal layer in one repeating unit Q are mirror images of the structures of the active layer, first conductive layer, second conductive layer, first source-drain metal layer, and second source-drain metal layer in the other repeating unit Q. On this basis, two third conductive blocks 23 in the same repeating unit Q can be connected to each other, and can be connected to the first power line VDD in the first source-drain metal layer SD1 at the connection point.

As shown in FIG. 16, in some embodiments, the third conductive block 23 can include a first sub conductive block 231, a second sub conductive block 232, and a third sub conductive block 233 connected in sequence. An orthographic projection of the first sub conductive block 231 on the base substrate is located on an orthographic projection of the eleventh active part POL11 on the base substrate, and at least partially overlaps with an orthographic projection of an adjacent data signal line on the base substrate, thereby reducing the signal interference from the adjacent data signal line Data to the first node N1. An orthographic projection of the third sub conductive block 233 on the base substrate extends along the column direction and is located between an orthographic projection of the first bridging part 31 on the base substrate and an orthographic projection of another data signal line far away from the first sub conductive block 231 on the base substrate, so that the third sub conductive block 233 can reduce the signal interference of the data signal line on the other side to the first node N1. The third conductive block 23 can reduce the signal interference due to changes of the data voltage on both sides to the first node N1, reduce the voltage fluctuation of the driving transistor T3 in the pixel driving circuit during the light-emitting stage, and thus improve the picture quality. An orthographic projection of the second sub conductive block 232 on the base substrate at least partially overlaps with an orthographic projection of the ninth active part POL9 on the base substrate. In some embodiments, the width of the second sub conductive block 232 is greater than the width of the ninth active part POL9 at the overlapping position, to cover the ninth active part POL9 at the overlapping position, so that the second sub conductive block 232 can stabilize the voltage of the ninth active part POL9. In this way, the noise influence of the data signal line Vdata or other signal lines to the ninth active part POL9 can be eliminated or reduced. Because the ninth active part POL9 is connected to the first node N1, the voltage stabilizing on the ninth active part POL9 can reduce the voltage fluctuation of the driving transistor T3 in the pixel driving circuit during the light-emitting stage.

The second conductive blocks 22 located in the same row are connected to each other, and each of the second conductive blocks 22 is connected to the first power line VDD at the connection point, thereby connecting the second electrode plate of the storage capacitor Cst to the first power line VDD.

The difference between the present embodiment and the above embodiments is that in the present embodiment, a third source-drain metal layer SD3 can be further included. On this basis, as shown in FIG. 17, in some embodiments, the first source-drain metal layer SD1 can include a first power line VDD. The first power line VDD can extend along the column direction and be used to provide the first power supply terminal in FIG. 1. The first power line VDD can be connected to the fifteenth active part POL15. That is, the difference from the above embodiments is that the first power line VDD in some embodiments is directly connected to the first electrode of the fifth transistor T5.

In some embodiments, the first source-drain metal layer SD1 can further include a first bridging part 31 to a third bridging part 33, as well as a first electrode transposition part 35 and a first data transposition part VdataL1. The above structures have the same functions as the corresponding structures in the structure layout shown in FIG. 3, and will not be repeated here. It should be noted that in some embodiments, the third bridging part 33 extends along the column direction, and the first power line VDD is directly connected to the first electrode of the fifth transistor T5 through a via hole. Therefore, in some embodiments, the first source-drain metal layer SD1 does not have the fourth bridging part 34 as shown in the structure layout of FIG. 3. The first data transposition part VdataL1 can be connected to the thirteenth active part POL13, so as to be connected to the second electrode of the fourth transistor T4, and the first electrode transposition part 35 can be connected to the sixteenth active part POL16, so as to be connected to the second electrode of the sixth transistor T6 and the second electrode of the seventh transistor T7.

As shown in FIG. 18, in some embodiments, the second source-drain metal layer SD2 can include multiple fan-out transposition lines FIP-H. The fan-out transposition lines FIP-H can extend along the row direction. The fan-out transposition lines FIP-H can be located between two adjacent rows of sub pixels, i.e., the fan-out transposition lines FIP-H are arranged between the two rows of sub pixels. The difference from the structure layout shown in FIG. 3 is that in some embodiments, the fan-out transposition lines FIP-H are located in the second source-drain metal layer SD2, and in addition to this, the fan-out transposition lines FIP-H can have all features of the fan-out transposition lines FIP-H as shown in the structure layout of FIG. 3, which will not be repeated here.

As shown in FIG. 18, the second source-drain metal layer SD2 can further include multiple first power transposition lines VDDL. The first power transposition lines VDDL can extend along the row direction. The first power transposition lines VDDL can be connected to the first power line VDD, forming a parallel structure of the first power line VDD. On the one hand, the parallel structure can reduce the line resistance of the first power line VDD, thereby reducing the voltage drop loss on the first power line VDD. On the other hand, when the first power line VDD breaks, a path can be formed through the first power transposition line VDDL, which can avoid the situation where the pixel driving circuit cannot work properly due to the breakage of the first power line VDD and improve the reliability of the display panel.

As shown in FIG. 18, the second source-drain metal layer SD2 can further include multiple second data transposition parts VdataL2 and multiple second electrode transposition parts 42. The second data transposition part VdataL2 can be connected to the first data transposition part VdataL1, and the second electrode transposition part 42 can be connected to the first electrode transposition part 35.

As shown in FIG. 19, in some embodiments, the third source-drain metal layer SD3 can include a data signal line Data. One pixel column is provided with one first data signal line DT1 and one second data signal line DT2 correspondingly. The data signal line Data can have all features of the data signal line Data as shown in the structure layout in FIG. 3, which will not be repeated here.

As shown in FIG. 19, in some embodiments, the third source-drain metal layer SD3 can further include a data fan-out line FIP-V and a second power transposition line SIP. The difference from the above embodiments is that in some embodiments, one pixel column is provided with two data fan-out lines FIP-V and/or two second power transposition lines SIP correspondingly, and orthographic projections of the data fan-out lines FIP-V and the second power transposition lines SIP on the base substrate are located on an orthographic projection of the semiconductor unit ACT0 on the base substrate in the corresponding column. That is, in some embodiments, the data fan-out lines FIP-V and the second power transposition lines SIP also pass through the middle of the pixel column.

In some embodiments, by providing two data fan-out lines FIP-V in one pixel column, the number of pixel columns occupied by the data fan-out lines FIP-V is reduced, allowing for the arrangement of the second power transposition lines SIP in the remaining pixel columns. Therefore, compared to the structure layout shown in FIG. 3, the display panel of the present embodiment can be provided with a larger number of the second power transposition lines SIP. In this way, the signal resistance of the second power line VSS can be further reduced, which is conducive to further improving the display quality.

The leading-out structure of the data signal line Data after transposition in some embodiments will be further explained in the following with reference to the drawings.

As shown in FIG. 20, in some embodiments, the two data fan-out lines FIP-V located in the same pixel column are a first sub transposition line FIP-V1 and a second sub transposition line FIP-V2. The first data signal line DT1 located in the $1^{st}$ pixel column is connected to the $k^{th}$ fan-out transposition line FIP-H, and the $k^{th}$ fan-out transposition line FIP-H is also connected to the first sub transposition line FIP-V1 located in the $m^{th}$ pixel column. The second data signal line DT2 located in the $1^{st}$ pixel column is connected to the $(k-1)^{th}$ fan-out transposition line FIP-H, and the $(k-1)^{th}$ fan-out transposition line FIP-H is also connected to the second sub transposition line FIP-V2 located in the $m^{th}$ pixel column. The first data signal line DT1 located in the $n^{th}$ pixel column is connected to the $(k+2n-2)^{th}$ fan-out transposition line FIP-H, and the $(k+2n-2)^{th}$ fan-out transposition line FIP-H is also connected to the first sub transposition line FIP-V1 located in the $(m+n)^{th}$ pixel column. The second data signal line DT2 located in the $n^{th}$ pixel column is connected to the $(k+2n-3)^{th}$ fan-out transposition line FIP-H, and the $(k+2n-3)^{th}$ fan-out transposition line FIP-H is also connected to the second sub transposition line FIP-V2 located in the $(m+n)^{th}$ pixel column, where n is a natural number greater than 1, m is a natural number greater than n and less than N−2n, N is the total number of pixel columns in the display panel, and k is a natural number greater than 1.

In some embodiments, taking k=5, m=20, n=30 as an example, the first data signal line DT1 located in the $1^{st}$ pixel column is connected to the $5^{th}$ fan-out transposition line FIP-H, and the $5^{th}$ fan-out transposition line FIP-H is then connected to the first sub transposition line FIP-V1 located in the $20^{th}$ pixel column. The second data signal line DT2 located in the $1^{st}$ pixel column is connected to the $4^{th}$ fan-out transposition line FIP-H, and the $4^{th}$ fan-out transposition line FIP-H is then connected to the second sub transposition line FIP-V2 located in the $20^{th}$ pixel column. Therefore, both the first data signal line DT1 and the second data signal line DT2 of the $1^{st}$ pixel column are transferred to the $20^{th}$ pixel column, to be leaded out there. Similarly, the first data signal line DT1 located in the $30^{th}$ pixel column is connected to the first sub transposition line FIP-V1 located in the $50^{th}$ pixel column through the $63^{rd}$ fan-out transposition line FIP-H, and the second data signal line DT2 located in the $30^{th}$ pixel column is connected to the second sub transposition line FIP-V2 located in the $50^{th}$ pixel column through the $62^{nd}$ fan-out transposition line FIP-H, so that both the first data signal line DT1 and the second data signal line DT2 of the $30^{th}$ pixel column are transferred to the $50^{th}$ pixel column of the panel, to be leaded out there. In this way, the data signal lines Data located in the $1^{st}$ pixel column to the $30^{th}$ pixel column can be transferred to the $20^{th}$ pixel column to the $50^{th}$ pixel column of the panel, to be leaded out there, thereby reducing the diagonal height of the wiring drawn from the left and right sides of the fan-out area FOUT towards the middle of the panel, and reducing the size of the lower border. Compared with the above embodiments, it can be seen that in the present embodiment, one pixel column is provided with two data fan-out lines FIP-V correspondingly, thus the number of pixel columns occupied by the data fan-out line FIP-V can be reduced, and the saved pixel column space can be provided with the second power transposition line SIP. Therefore, more second power transposition lines SIP can be arranged, which, compared to the above embodiments, can further reduce the signal resistance of the second power line VSS and improve the display quality.

In some embodiments, the display panel can also lead the data signal lines out in descending order as described in aforementioned embodiments. For example, the two data fan-out lines FIP-V located in the same pixel column are the first sub transposition line FIP-V1 and the second sub transposition line FIP-V2. The first data signal line DT1 located in the $1^{st}$ pixel column is connected to the $k^{th}$ fan-out transposition line FIP-H, and the $k^{th}$ fan-out transposition line FIP-H is also connected to the first sub transposition line FIP-V1 located in the $m^{th}$ pixel column. The second data signal line DT2 located in the $1^{st}$ pixel column is connected to the $(k-1)^{th}$ fan-out transposition line FIP-H, and the $(k-1)^{th}$ fan-out transposition line FIP-H is also connected to the second sub transposition line FIP-V2 located in the $m^{th}$ pixel column. The first data signal line DT1 located in the $n^{th}$ pixel column is connected to the $(k+2n-2)^{th}$ fan-out transposition line FIP-H, and the $(k+2n-2)^{th}$ fan-out transposition line FIP-H is also connected to the first sub transposition line FIP-V1 located in the $(m-n)^{th}$ pixel column. The second data signal line DT2 located in the $n^{th}$ pixel column is connected to the $(k+2n-3)^{th}$ fan-out transposition line FIP-H, and the $(k+2n-3)^{th}$ fan-out transposition line FIP-H is also connected to the second sub transposition line FIP-V2 located in the $(m-n)^{th}$ pixel column, where n is a natural number greater than 1, m is a natural number greater than 2n and less than N−n, N is the total number of pixel columns in the display panel, and k is a natural number greater than 1.

It should be understood that the above transposition between the data fan-out lines FIP-V and the fan-out transposition lines FIP-H is only illustrative and should not be understood as a limitation of the present disclosure. In actual products, the first data signal line DT1 and the second data signal line DT2 of the same pixel column can be leaded out not in the same pixel column. That is, the first data fan-out line FIP-V1 and the second data fan-out line FIP-V2 can be not in the same pixel column, which are within the protection scope of the present disclosure.

Figure 21:
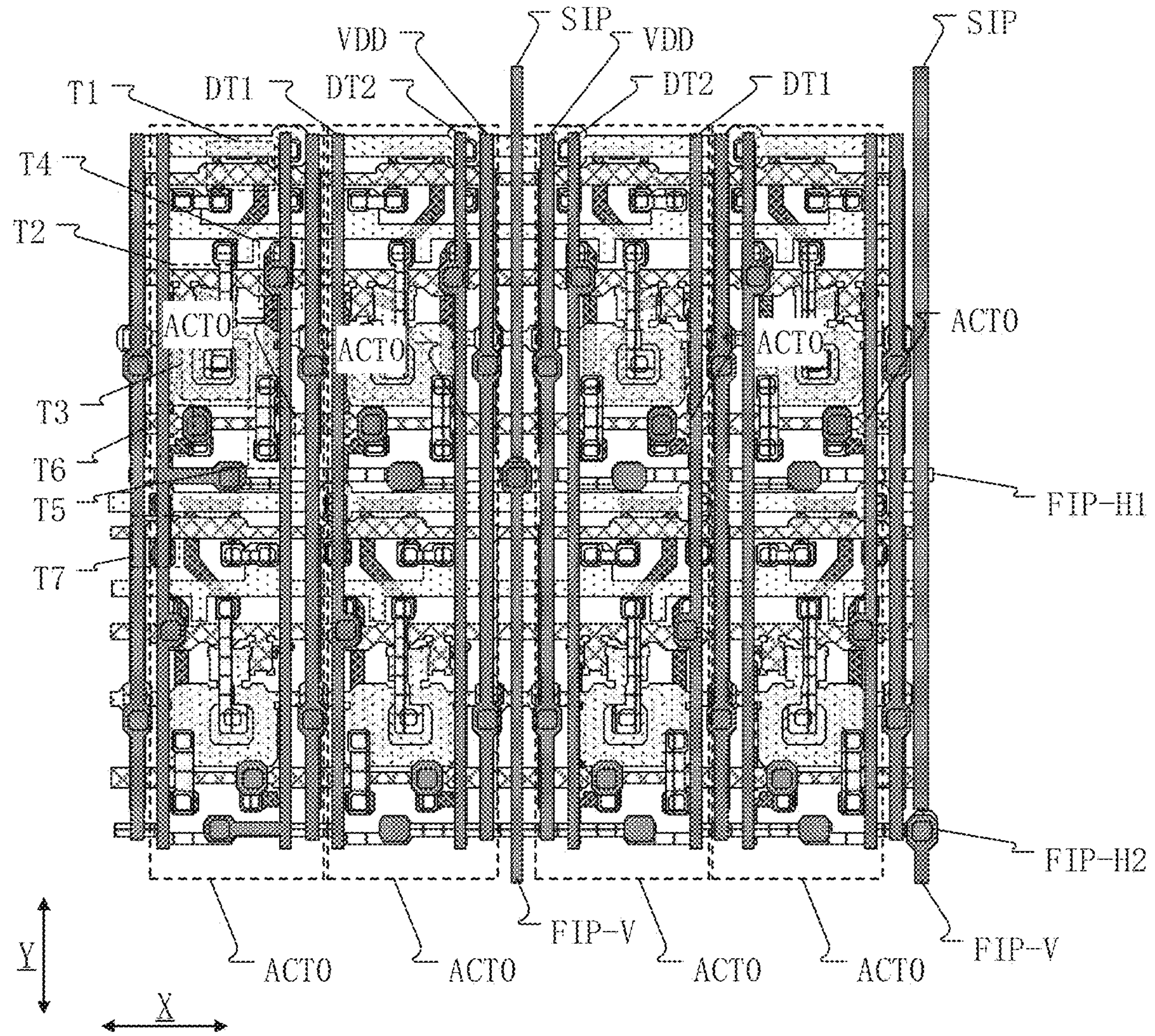
FIG. 21 is a structure layout of a display panel according to embodiments of the present disclosure.
Figure 22:
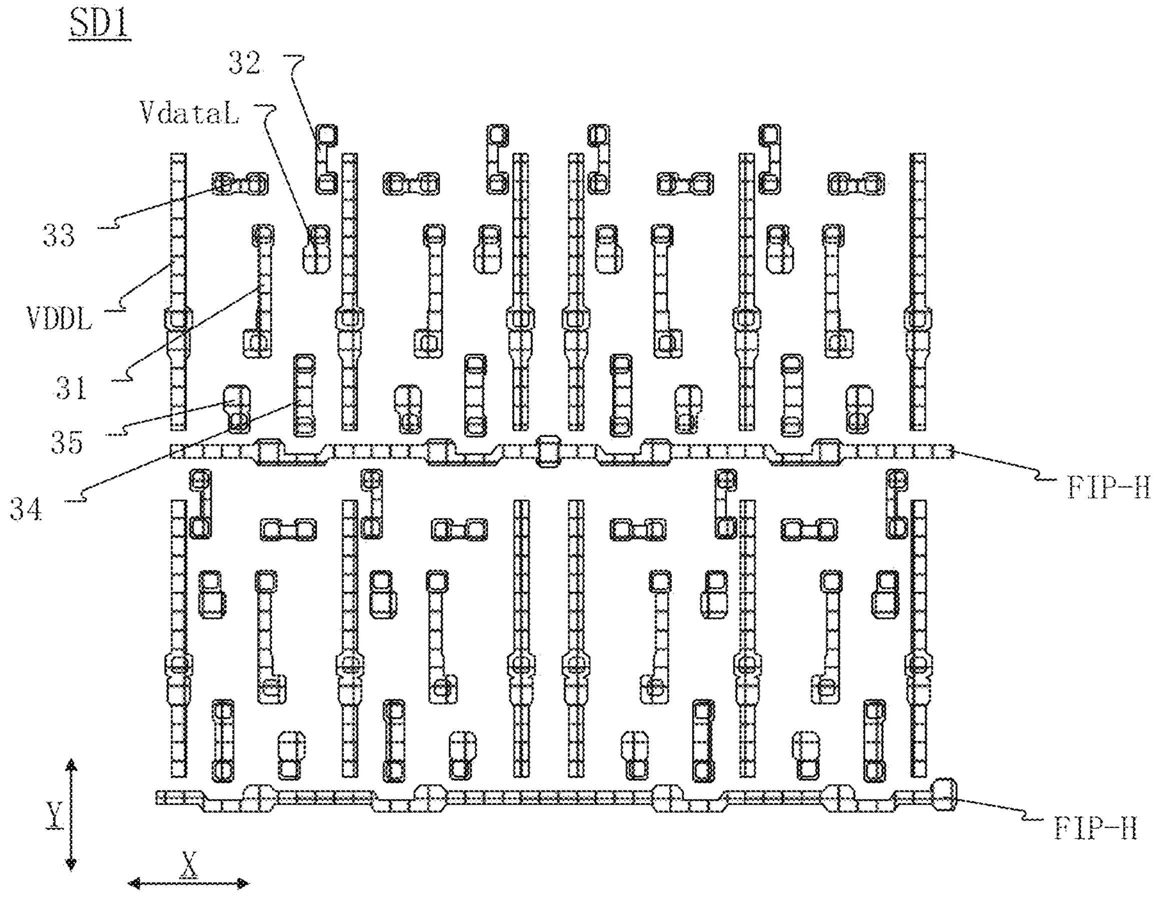
FIG. 22 is a structure layout of a first source-drain metal layer in FIG. 21.
Figure 23:
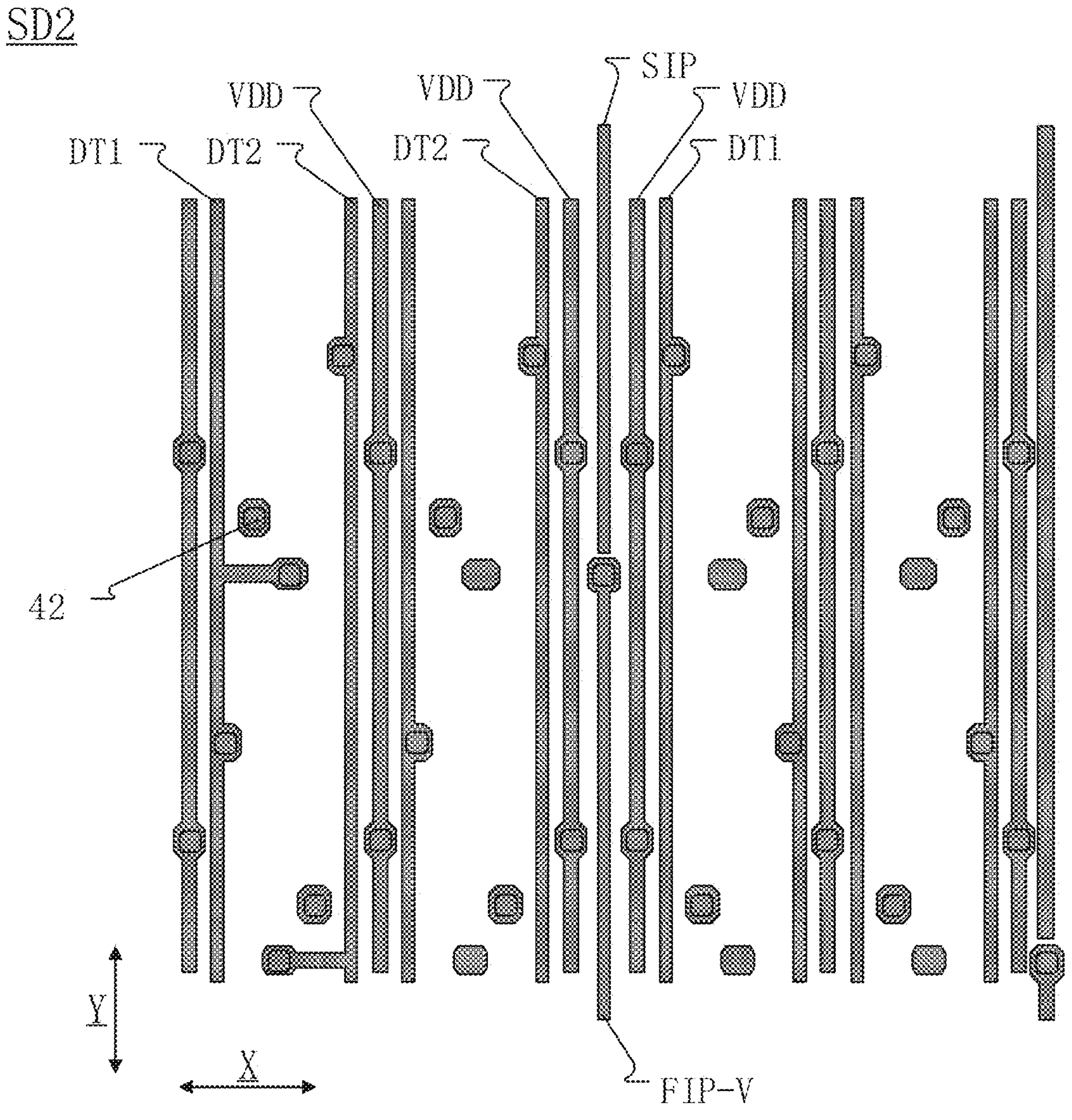
FIG. 23 is a structure layout of a second source-drain metal layer in FIG. 21.
Figure 24:
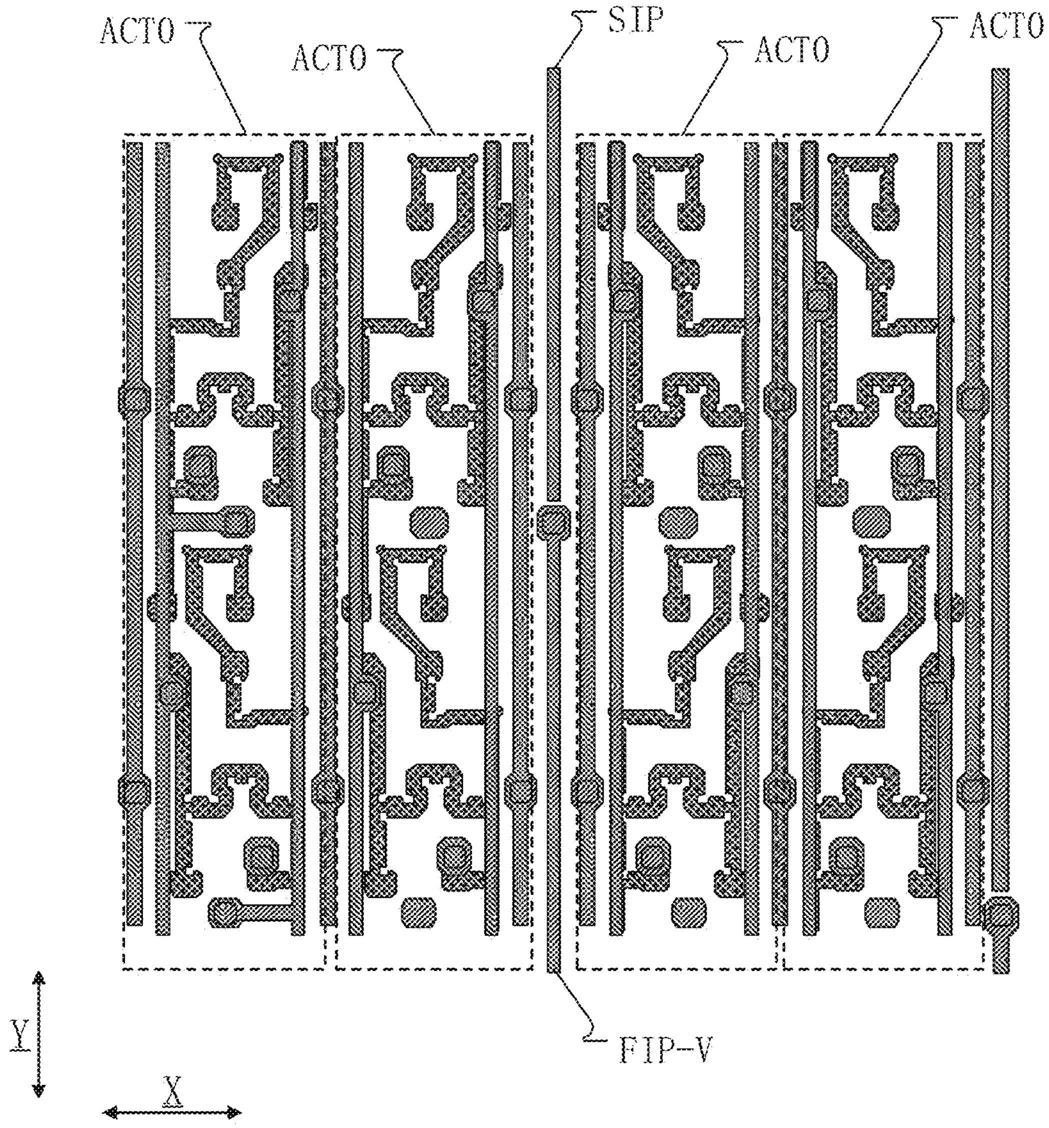
FIG. 24 is a stacked layout of an active layer and a second source-drain metal layer in FIG. 21.
Figure 25:
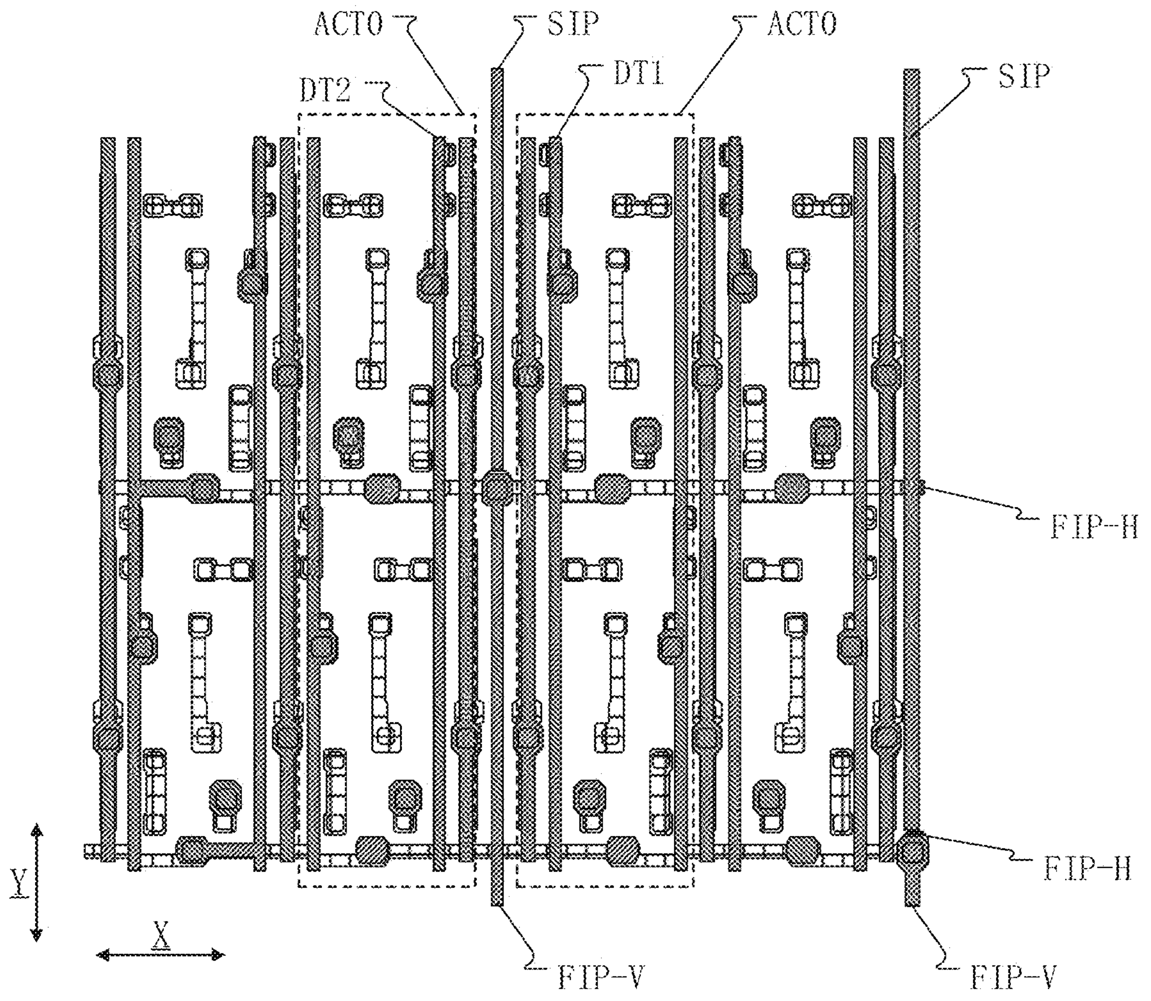
FIG. 25 is a stacked layout of a first source-drain metal layer and a second source-drain metal layer in FIG. 1.

On the basis of the above embodiments, FIG. 21 shows a structure layout of a display panel according to embodiments of the present disclosure, FIG. 22 shows a structure layout of a first source-drain metal layer in FIG. 21, FIG. 23 shows a structure layout of a second source-drain metal layer in FIG. 21, FIG. 24 shows a stacked layout of an active layer and a second source-drain metal layer in FIG. 21, and FIG. 25 shows a stacked layout of a first source-drain metal layer and a second source-drain metal layer in FIG. 1. In some embodiments, the first metal layer can be the first source-drain metal layer SD1, and the second metal layer can be the second source-drain metal layer SD2.

In some embodiments, the active layer Poly, the first conductive layer Gate1, the second conductive layer Gate2, and the first source-drain metal layer SD1 can correspond to all structural features of the active layer Poly, the first conductive layer Gate1, the second conductive layer Gate2, and the first source-drain metal layer SD1 as shown in FIG. 3, which will not be repeated here.

The difference from the structure layout shown in FIG. 3 is that the present embodiment saves the space occupied by sub pixels by compressing the width of the sub pixel, and the saved space is used to arrange the data fan-out line FIP-V and the second power transposition line SIP.

As shown in FIG. 24, in some embodiments, orthographic projections of the data fan-out line FIP-V and the second power transposition line SIP on the base substrate are located between orthographic projections of semiconductor units ACT0 on the base substrate in two adjacent columns. That is, the data fan-out line FIP-V is arranged between two adjacent columns of sub pixels. In some embodiments, the sizes of the sub pixels in the row direction can be compressed, for every two sub pixels, a wiring space for one data fan-out line FIP-V or one second power transposition line SIP is obtained through compressing, so that the data fan-out line FIP-V and the second power transposition line SIP pass through between two adjacent columns of sub pixels. In this way, the parasitic effect between the wiring of the added lines in the second source-drain metal layer SD2 and the sub-pixel can be reduced, thereby further reducing the crosstalk between signals.

As shown in FIG. 25, in some embodiments, the first data signal line DT1 located in the $1^{st}$ pixel column is connected to the $k^{th}$ fan-out transposition line FIP-H, and the $k^{th}$ fan-out transposition line FIP-H is also connected to the data fan-out line FIP-V located between the $m^{th}$ pixel column and the $(m+1)^{th}$ pixel column. The second data signal line DT2 located in the $1^{st}$ pixel column is connected to the $(k+1)^{th}$ fan-out transposition line FIP-H, and the $(k+1)^{th}$ fan-out transposition line FIP-H is also connected to the data fan-out line FIP-V located between the $(m+2)^{th}$ pixel column and the $(m+3)^{th}$ pixel column. The first data signal line DT1 located in the $n^{th}$ pixel column is connected to the $(k+2n-2)^{th}$ fan-out transposition line FIP-H, and the $(k+2n-2)^{th}$ fan-out transposition line FIP-H is also connected to the data fan-out line FIP-V located between the $(m+4n-4)^{th}$ pixel column and the $(m+4n-3)^{th}$ pixel column. The second data signal line DT2 located in the $n^{th}$ pixel column is connected to the $(k+2n-1)^{th}$ fan-out transposition line FIP-H, and the $(k+2n-1)^{th}$ fan-out transposition line FIP-H is also connected to the data fan-out line FIP-V located between the $(m+4n-2)^{th}$ pixel column and the $(m+4n-1)^{th}$ pixel column, where n is a natural number greater than 1, m is a natural number greater than n and less than N−5n+3, N is the total number of pixel columns in the display panel, and k is a natural number.

In some embodiments, taking k=5, m=20, n=30 as an example, the first data signal line DT1 located in the $1^{st}$ pixel column is connected to the $5^{th}$ fan-out transposition line FIP-H, and the $5^{th}$ fan-out transposition line FIP-H is then connected to the data fan-out line FIP-V between the $20^{th}$ pixel column and the $21^{st}$ pixel column, so that the first data signal line DT1 located in the $1^{st}$ pixel column is transferred between the $20^{th}$ pixel column and the $21^{st}$ pixel column, to be leaded out there. The second data signal line DT2 located in the $1^{st}$ pixel column is connected to the $6^{th}$ fan-out transposition line FIP-H, and the $6^{th}$ fan-out transposition line FIP-H is then connected to the data fan-out line FIP-V between the $22^{nd}$ pixel column and the $23^{rd}$ pixel column, so that the second data signal line DT2 located in the $1^{st}$ pixel column is transferred between the $22^{nd}$ pixel column and the $23^{rd}$ pixel column, to be leaded out there.

In some embodiments, the first data signal line DT1 located in the $30^{th}$ pixel column is connected to the data fan-out line FIP-V located between the $136^{th}$ pixel column and the $137^{th}$ pixel column through the $63^{rd}$ fan-out transposition line FIP-H, and the second data signal line DT2 located in the $30^{th}$ pixel column is connected to the data fan-out line FIP-V located between the $138^{th}$ pixel column and the $139^{th}$ pixel column through the $64^{th}$ fan-out transposition line FIP-H, so that the first data signal line DT1 and the second data signal line DT2 of the $30^{th}$ pixel column are respectively transferred between the $136^{th}$ pixel column and the $137^{th}$ pixel column, and between the $138^{th}$ pixel column and the $139^{th}$ pixel column, to be leaded out there. In this way, the diagonal height of the wiring drawn from the left and right sides of the fan-out area FOUT towards the middle of the panel can also be reduced, thereby reducing the size of the lower border. Compared with the structure layout shown in FIG. 3, it can be seen that in the present embodiment, the data fan-out line FIP-V is located between two adjacent columns of sub pixels, that is, the added data fan-out line FIP-V is outside the sub pixels. Therefore, the parasitic effect between the added data fan-out line FIP-V and the sub pixels, as well as between the added second power transposition line SIP and the sub pixels, can be further reduced, thereby further reducing the crosstalk between signals, which is conducive to improving the display quality under high-frequency driving.

In some embodiments, the display panel can also lead the data signal lines out in descending order as described in aforementioned embodiments. For example, the first data signal line DT1 located in the $1^{st}$ pixel column is connected to the $k^{th}$ fan-out transposition line FIP-H, and the $k^{th}$ fan-out transposition line FIP-H is also connected to the data fan-out line FIP-V located between the $m^{th}$ pixel column and the $(m-1)^{th}$ pixel column. The second data signal line DT2 located in the $1^{st}$ pixel column is connected to the $(k+1)^{th}$ fan-out transposition line FIP-H, and the $(k+1)^{th}$ fan-out transposition line FIP-H is also connected to the data fan-out line FIP-V located between the $(m-2)^{th}$ pixel column and the $(m-3)^{th}$ pixel column. The first data signal line DT1 located in the $n^{th}$ pixel column is connected to the $(2n-k)^{th}$ fan-out transposition line FIP-H, and the $(2n-k)^{th}$ fan-out transposition line FIP-H is also connected to the data fan-out line FIP-V located between the $(m-4n+3)^{th}$ pixel column and the $(m-4n+4)^{th}$ pixel column. The second data signal line DT2 located in the $n^{th}$ pixel column is connected to the $(2n-k+1)^{th}$ fan-out transposition line FIP-H, and the $(2n-k+1)^{th}$ fan-out transposition line FIP-H is also connected to the data fan-out line FIP-V located between the $(m-4n+1)^{th}$ pixel column and the $(m-4n+2)^{th}$ pixel column, where n is a natural number greater than 1, m is a natural number greater than $5n-1$ and less than $N-n$, N is the total number of pixel columns in the display panel, and k is a natural number, which will not be repeated here.

Figure 26:
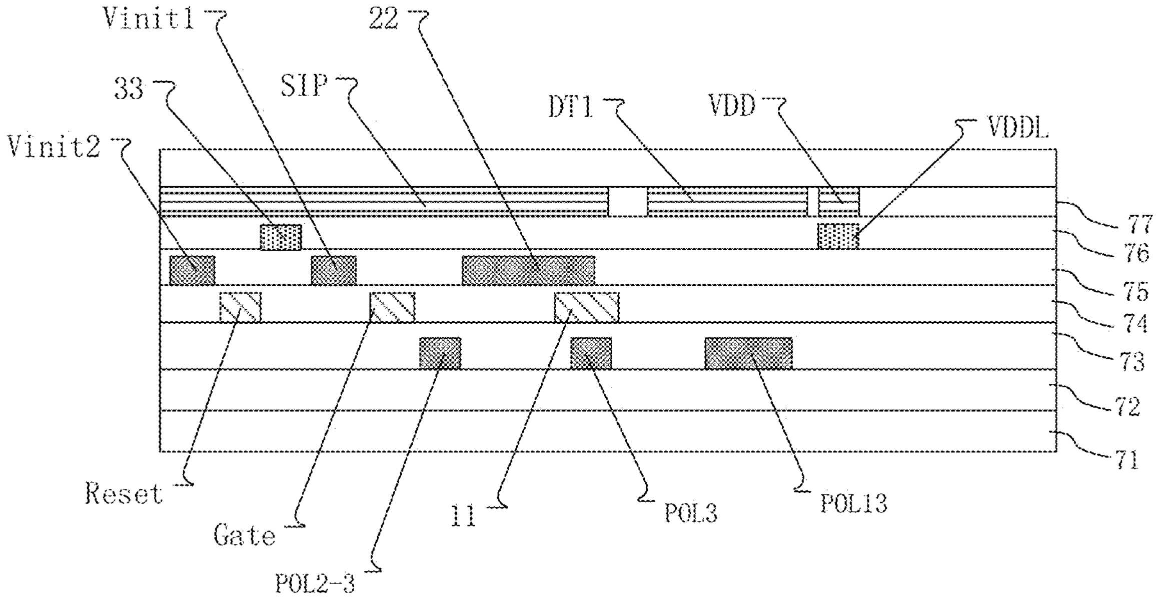
FIG. 26 is a cross-sectional view taken along the AA direction in FIG. 3.

FIG. 26 is a cross-sectional view taken along the AA direction in FIG. 3. The display panel can further include a buffer layer 72, a first insulating layer 73, a second insulating layer 74, a first dielectric layer 75, a passivation layer 76, and a second dielectric layer 77. In some embodiments, the base substrate 71, the buffer layer 72, the active layer Poly, the first insulating layer 73, the first conductive layer Gate1, the second insulating layer 74, the second conductive layer Gate2, the first dielectric layer 75, the first source-drain metal layer SD1, the passivation layer 76, the second dielectric layer 77, and the second metal layer SD2 are stacked in sequence. The first insulating layer 73 can be an organic insulating layer. The second insulating layer 74 can be silicon oxide. The first dielectric layer 75 and the second dielectric layer 77 can be silicon nitride layers. The materials of the passivation layer 76 and the buffer layer 72 can be silicon oxide, silicon nitride, etc. The base substrate 71 can include a rigid substrate or a flexible substrate, a barrier layer, and a polyimide layer stacked in sequence. The rigid substrate can be a glass substrate. The flexible substrate can be formed of materials such as polyimide (PI) or polyethylene terephthalate (PET). The barrier layer can be formed of inorganic materials. The materials of the first conductive layer Gate1 and the second conductive layer Gate2 can be one of molybdenum, aluminum, copper, titanium, niobium, or alloys thereof, or molybdenum/titanium alloys, or laminates. The materials of the first source-drain metal layer SD1 and the second metal layer SD2 can include metal materials, such as one of molybdenum, aluminum, copper, titanium, niobium, or alloys thereof, or molybdenum/titanium alloys, or laminates, or titanium/aluminum/titanium laminates.

It should be understood that the terms "first", "second", "third", etc. used in the present disclosure are only for marking purposes, to distinguish names of different structures, and do not limit the number of the objects or have any order relationship.

The present disclosure also provides a display device including a display panel as described in any of embodiments of the present disclosure.

After considering the specification and practicing of the invention disclosed herein, those skilled in the art will easily come up with other implementation solutions of the present disclosure. The present disclosure aims to cover any variations, uses, or adaptive changes of the present disclosure, which follow the general principles of the present disclosure and include common knowledge or commonly used technical means in the art that are not disclosed in the present disclosure. The specification and embodiments are only considered exemplary, and the true scope and spirit of the present disclosure are defined by appended claims.

What is claimed is:

1. A display panel, comprising multiple pixel driving circuits arranged in an array along a first direction and a second direction, wherein the multiple pixel driving circuits comprise first pixel driving circuits and second pixel driving circuits distributed at intervals along the second direction, the second direction intersects with the first direction, and the display panel further comprises:

a base substrate;

a first metal layer located on a side of the base substrate, wherein the first metal layer comprises multiple fan-out transposition lines, and orthographic projections on the base substrate of the multiple fan-out transposition lines extend along the first direction; and a second metal layer located on a side of the first metal layer away from the base substrate, wherein the second metal layer comprises multiple data signal lines and multiple data fan-out lines, orthographic projections on the base substrate of the multiple data signal lines extend along the second direction and are distributed at intervals along the first direction, and orthographic projections on the base substrate of the multiple data fan-out lines extend along the second direction and are distributed at intervals along the first direction;

wherein the multiple data signal lines comprise multiple first data signal lines and multiple second data signal lines alternately distributed along the first direction, a pixel column corresponds to one of the first data signal lines and one of the second data signal lines, and the first data signal line and the second data signal line are arranged on both sides of the pixel column that the first data signal line and the second data signal line correspond to, and wherein the first data signal line is connected to the first pixel driving circuits, and the second data signal line is connected to the second pixel driving circuits; and wherein at least some of the data signal lines far away from a middle area of the display panel are connected to the fan-out transposition lines, and the fan-out transposition lines are further connected to the data fan-out lines close to the middle area of the display panel;

wherein the first direction is a row direction, the second direction is a column direction, and the display panel further comprises:

an active layer located between the base substrate and the first metal layer, wherein the active layer comprises multiple semiconductor units arranged in an array along the row direction and the column direction, and one of the semiconductor units corresponds to one of the pixel driving circuits;

wherein an orthographic projection on the base substrate of a data fan-out line is located on an orthographic projection on the base substrate of a semiconductor unit in a pixel column that the data fan-out line corresponds to; and wherein at least one of the semiconductor units comprises a storage capacitor, and the orthographic projection on the base substrate of the data fan-out line overlaps with the storage capacitor.

2. The display panel according to claim 1, further comprising:

multiple light-emitting devices, wherein second electrodes of the multiple light-emitting devices are connected to a second power supply terminal; and wherein the second metal layer further comprises:

multiple second power transposition lines, wherein orthographic projections on the base substrate of the multiple second power transposition lines extend along the column direction and are distributed at intervals along the row direction, and an orthographic projection on the base substrate of a second power transposition line is located on an orthographic projection on the base substrate of a semiconductor unit in a pixel column that the second power transposition line corresponds to;

wherein some of the second power transposition lines and some of the data fan-out lines are located in the same pixel columns and are not connected with the data fan-out lines, and some of the second power transposition lines and some of the data fan-out lines are located in different pixel columns; and wherein the second power transposition lines are connected to a second power line in a non-display area of the display panel, and the second power line is used to provide the second power supply terminal.

3. The display panel according to claim 2, wherein the first metal layer is a first source-drain metal layer, and the second metal layer is a second source-drain metal layer; and wherein a column of semiconductor units corresponds to one of the data fan-out lines and/or one of the second power transposition lines.

4. The display panel according to claim 3, wherein at least one of the pixel driving circuits comprises a first transistor, a second transistor, and a driving transistor, and a second electrode of the first transistor and a first electrode of the second transistor are connected to a gate of the driving transistor;

wherein at least one of the semiconductor units comprises:

a first active part used to form a channel region of the first transistor;

a second active part used to form a channel region of the second transistor;

a third active part used to form a channel region of the driving transistor; and a ninth active part connected between the first active part and the second active part, and used to form the second electrode of the first transistor and the first electrode of the second transistor;

wherein the first metal layer further comprises:

a first bridging part, wherein an orthographic projection on the base substrate of the first bridging part extends along the column direction, one end of the first bridging part is connected to the third active part, and the other end of the first bridging part is connected to the ninth active part; and wherein an orthographic projection on the base substrate of a data fan-out line partially overlaps with an orthographic projection on the base substrate of the first bridging part in a pixel column that the data fan-out line corresponds to, and a ratio of an area of an overlapping portion to an area of the orthographic projection on the base substrate of the first bridging part is less than or equal to 10%, or the orthographic projection on the base substrate of the data fan-out line does not overlap with the orthographic projection on the base substrate of the first bridging part in the pixel column that the data fan-out line corresponds to.

5. The display panel according to claim 3, wherein at least one of the pixel driving circuits comprises a first transistor, a first electrode of the first transistor is connected to a first initial signal terminal, and a second electrode of the first transistor is connected to a gate of the driving transistor;

wherein at least one of the semiconductor units comprises:

a third active part used to form a channel region of the driving transistor;

a ninth active part used to form the second electrode of the first transistor;

a tenth active part used to form the first electrode of the first transistor;

a first conductive layer located between the active layer and the first metal layer, and the first conductive layer comprises:

a first conductive block, wherein an orthographic projection on the base substrate of the first conductive block covers an orthographic projection on the base substrate of the third active part, and the first conductive block is used to form the gate of the driving transistor;

a second conductive layer located between the first conductive layer and the first metal layer, and the second conductive layer comprises:

a first initial signal line, wherein an orthographic projection on the base substrate of the first initial signal line extends along the row direction;

wherein the first metal layer further comprises:

a first bridging part, wherein an orthographic projection on the base substrate of the first bridging part extends along the column direction, one end of the first bridging part is connected to the first conductive block, and the other end of the first bridging part is connected to the ninth active part;

a third bridging part, wherein an orthographic projection on the base substrate of the third bridging part extends along the row direction, and the third bridging part is connected to the tenth active part; and a data transposition part connected to a corresponding data signal line; and wherein the first initial signal line comprises a main body part, a first addition part, and a second addition part, an orthographic projection on the base substrate of the main body part extends along the row direction, the first addition part and the second addition part are connected to both sides of the main body part, the first addition part is connected to the third bridging part, and an orthographic projection on the base substrate of the second addition part is located between the orthographic projection on the base substrate of the first bridging part and an orthographic projection on the base substrate of a corresponding data transposition part.

6. The display panel according to claim 3, wherein at least one of the pixel driving circuits comprises a second transistor, and a driving transistor, a first electrode of the second transistor is connected to a gate of the driving transistor, a first electrode plate of the storage capacitor is connected to the gate of the driving transistor, and a second electrode plate of the storage capacitor is connected to the first power supply terminal;

wherein at least one of the semiconductor units comprises:

a second active part comprising a third sub active part and a fourth sub active part, wherein the third sub active part and the fourth sub active part are respectively used to form two channel regions of the second transistor; and an eleventh active part connected between the third sub active part and the fourth sub active part;

wherein the display panel further comprises:

a first conductive layer located between the active layer and a second conductive layer, wherein the first conductive layer comprises:

a first conductive block, wherein an orthographic projection on the base substrate of the first conductive block covers an orthographic projection on the base substrate of the third active part, and the first conductive block is used to form the gate of the driving transistor and the first electrode plate of the storage capacitor;

the second conductive layer located between the active layer and the first metal layer, wherein the second conductive layer comprises:

a second conductive block, wherein an orthographic projection on the base substrate of the second conductive block is located on the orthographic projection on the base substrate of the first conductive block, the second conductive block is used to form the second electrode plate of the storage capacitor, and two adjacent second conductive blocks along the row direction are connected in sequence through a first connection part; and a third conductive block, wherein an orthographic projection on the base substrate of the third conductive block is located on an orthographic projection on the base substrate of the eleventh active part, and the third conductive block is further connected to the second conductive block;

wherein the first metal layer further comprises:

a first power transposition line connected to the first connection part; and wherein the second metal layer further comprises:

a first power cord connected to the first power transposition line.

7. The display panel according to claim 6, wherein the orthographic projection on the base substrate of the third conductive block and the orthographic projection on the base substrate of the second conductive block are at least partially located between an orthographic projection on the base substrate of a first bridging part and orthographic projection on the base substrate of the two data signal lines.

8. The display panel according to claim 3, wherein the semiconductor unit comprises:

a third active part used to form a channel region of a driving transistor;

a fourth active part used to form a channel region of a fourth transistor; and a fourteenth active part connected to a side of the fourth active part, and used to form a first electrode of the fourth transistor;

wherein the first metal layer further comprises:

a data transposition part connected to the fourteenth active part; and wherein a fourth active part located in at least one of the first pixel driving circuits and a fourth active part located in at least one of the second pixel driving circuits are located on both sides of the third active part along the row direction, the first data signal line is connected to the data transposition part in the first pixel driving circuit, and the second data signal line is connected to the data transposition part in the second pixel driving circuit.

9. The display panel according to claim 2, wherein the first metal layer is a second source-drain metal layer, and the second metal layer is a third source-drain metal layer; and wherein a column of semiconductor units corresponds to two of the data fan-out lines and/or two of the second power transposition lines.

10. The display panel according to claim 9, wherein at least one of the pixel driving circuits comprises a driving transistor, at least one of the semiconductor units comprises a third active part, and the third active part is used to form a channel region of the driving transistor;

wherein orthographic projections on the base substrate of two data fan-out lines located in the same pixel column and/or orthographic projections on the base substrate of one data fan-out line and one second power transposition line located in the same pixel column are located on both sides of an orthographic projection on the base substrate of the third active part located in the same pixel column, and are located between orthographic projections on the base substrate of two data signal lines located in the same pixel column; and wherein orthographic projections on the base substrate of two second power transposition lines located in the same pixel column are located on both sides of an orthographic projection on the base substrate of the third active part located in the same pixel column, and are located between orthographic projections on the base substrate of two data signal lines located in the same pixel column.

11. The display panel according to claim 9, further comprising:

a first source-drain metal layer located between the active layer and the second source-drain metal layer, and the first source-drain metal layer comprises:

multiple first power lines, wherein orthographic projections on the base substrate of the multiple first power lines extend along the column direction and are distributed at intervals along the row direction;

wherein the second source-drain metal layer further comprises:

multiple first power transposition lines, wherein orthographic projections on the base substrate of the multiple first power transposition lines extend along the row direction and are distributed at intervals along the column direction, and the first power transposition lines are connected to the first power lines.

12. The display panel according to claim 9, further comprising:

a first conductive layer, a second conductive layer, and a first source-drain metal layer stacked in sequence between the active layer and the second source-drain metal layer; and multiple repeating units arranged in an array along the row direction and the column direction, and the repeating units comprise a third pixel driving circuit and a fourth pixel driving circuit arranged adjacent to each other along the row direction;

wherein in the same repeating unit, structures of the active layer, the first conductive layer, the second conductive layer, the first source-drain metal layer, and the second source-drain metal layer in the third pixel driving circuit correspondingly form mirror images of structures of the active layer, the first conductive layer, the second conductive layer, the first source-drain metal layer, and the second source-drain metal layer in the fourth pixel driving circuit; and wherein in any two adjacent repeating units along the row direction, structures of the active layer, the first conductive layer, the second conductive layer, the first source-drain metal layer, and the second source-drain metal layer in one repeating unit correspondingly form mirror images of structures of the active layer, the first conductive layer, the second conductive layer, the first source-drain metal layer, and the second source-drain metal layer in the other repeating unit.

13. The display panel according to claim 12, wherein at least one of the pixel driving circuits comprises a second transistor, and a driving transistor, a first electrode of the second transistor is connected to a gate of the driving transistor, a first electrode plate of the storage capacitor is connected to the gate of the driving transistor, and a second electrode plate of the storage capacitor is connected to the first power supply terminal;

wherein at least one of the semiconductor units comprises:

a second active part comprising a third sub active part and a fourth sub active part, wherein the third sub active part and the fourth sub active part are respectively used to form a first channel region and a second channel region of the second transistor;

a third active part used to form a channel region of the driving transistor; and an eleventh active part connected between the third sub active part and the fourth sub active part;

wherein the display panel further comprises:

the first conductive layer located between the active layer and the second source-drain metal layer, wherein the first conductive layer comprises:

a first conductive block, wherein an orthographic projection on the base substrate of the first conductive block covers an orthographic projection on the base substrate of the third active part, and the first conductive block is used to form the first electrode plate of the storage capacitor;

the second conductive layer located between the active layer and the second source-drain metal layer, wherein the second conductive layer comprises:

a third conductive block, wherein an orthographic projection on the base substrate of the third conductive block is located on an orthographic projection on the base substrate of the eleventh active part; and a second conductive block, wherein an orthographic projection on the base substrate of the second conductive block is located on the orthographic projection on the base substrate of the first conductive block, and the second conductive block is used to form the second electrode plate of the storage capacitor;

the first source-drain metal layer located between the second conductive layer and the second source-drain metal layer, wherein the first source-drain metal layer comprises:

a first power line, wherein an orthographic projection on the base substrate of the first power line extends along the column direction; and wherein in the same repeating unit, the third conductive blocks in two pixel driving circuits are connected to each other, and the first power line is connected at where the third conductive blocks are connected; and wherein the second conductive block is not connected to the third conductive block, any two second conductive blocks in the same row are connected to each other, and the first power line is connected at where the second conductive blocks are connected.

14. The display panel according to claim 13, wherein at least one of the pixel driving circuits comprises a first transistor, the second transistor, and the driving transistor, a second electrode of the first transistor and the first electrode of the second transistor are connected to the gate of the driving transistor;

wherein at least one of the semiconductor units comprises:

a first active part used to form a channel region of the first transistor;

the second active part used to form two channel regions of the second transistor;

the third active part used to form the channel region of the driving transistor; and a ninth active part connected between the first active part and the second active part, and used to form the second electrode of the first transistor and the first electrode of the second transistor;

wherein the first metal layer further comprises:

a first bridging part, wherein an orthographic projection on the base substrate of the first bridging part extends along the column direction, one end of the first bridging part is connected to the third active part, the other end of the first bridging part is connected to the ninth active part, and the orthographic projection on the base substrate of the first bridging part is located between orthographic projections on the base substrate of two data signal lines in the same pixel column; and wherein the third conductive block comprises a first sub conductive block, a second sub conductive block, and a third sub conductive block that are connected in sequence, an orthographic projection on the base substrate of the first sub conductive block is located on the orthographic projection on the base substrate of the eleventh active part and at least partially overlaps with an orthographic projection on the base substrate of an adjacent data signal line, an orthographic projection on the base substrate of the third sub conductive block extends along the column direction and is located between an orthographic projection on the base substrate of the first bridging part and an orthographic projection on the base substrate of another data signal line far away from the first conductive block, and an orthographic projection on the base substrate of the second sub conductive block extends along the column direction and is located on an orthographic projection on the base substrate of the ninth active part.

15. The display panel according to claim 9, wherein at least one of the pixel driving circuits comprises a first transistor, a second transistor, and a driving transistor, and a second electrode of the first transistor and a first electrode of the second transistor are connected to a gate of the driving transistor;

wherein at least one of the semiconductor units comprises:

a first active part used to form a channel region of the first transistor;

a second active part used to form a channel region of the second transistor;

a third active part used to form a channel region of the driving transistor; and a ninth active part connected between the first active part and the second active part, and used to form the second electrode of the first transistor and the first electrode of the second transistor;

wherein the first metal layer further comprises:

a first bridging part, wherein an orthographic projection on the base substrate of the first bridging part extends along the column direction, one end of the first bridging part is connected to the third active part, and the other end of the first bridging part is connected to the ninth active part; and wherein an orthographic projection on the base substrate of a data fan-out line partially overlaps with an orthographic projection on the base substrate of the first bridging part in a pixel column that the data fan-out line corresponds to, and a ratio of an area of an overlapping portion to an area of the orthographic projection on the base substrate of the first bridging part is less than or equal to 10%, or the orthographic projection on the base substrate of the data fan-out line does not overlap with the orthographic projection on the base substrate of the first bridging part in the pixel column that the data fan-out line corresponds to.

16. The display panel according to claim 9, wherein the semiconductor unit comprises:

a third active part used to form a channel region of a driving transistor;

a fourth active part used to form a channel region of a fourth transistor; and a fourteenth active part connected to a side of the fourth active part, and used to form a first electrode of the fourth transistor;

wherein the first metal layer further comprises:

a data transposition part connected to the fourteenth active part; and wherein a fourth active part located in at least one of the first pixel driving circuits and a fourth active part located in at least one of the second pixel driving circuits are located on both sides of the third active part along the row direction, the first data signal line is connected to the data transposition part in the first pixel driving circuit, and the second data signal line is connected to the data transposition part in the second pixel driving circuit.

17. The display panel according to claim 1, wherein the first direction is a row direction, the second direction is a column direction, and the display panel further comprises:

an active layer located between the base substrate and the first metal layer, wherein the active layer comprises multiple semiconductor units arranged in an array along the row direction and the column direction, and one of the semiconductor units corresponds to one of the pixel driving circuits; and wherein an orthographic projection on the base substrate of a data fan-out line is located between orthographic projections on the base substrate of two adjacent columns of semiconductor units.

18. The display panel according to claim 17, further comprising:

multiple light-emitting devices, wherein second electrodes of the multiple light-emitting devices are connected to a second power supply terminal; and wherein the second metal layer further comprises:

multiple second power transposition lines, wherein orthographic projections on the base substrate of the multiple second power transposition lines extend along the column direction and are distributed at intervals along the row direction, and an orthographic projection on the base substrate of a second power transposition line is located between the orthographic projections on the base substrate of two adjacent columns of semiconductor units;

wherein some of the second power transposition lines and some of the data fan-out lines are located in the same pixel columns and are not connected with the data fan-out lines, and some of the second power transposition lines and some of the data fan-out lines are located in different pixel columns; and wherein the second power transposition lines are connected to a second power line in a non-display area of the display panel, and the second power line is used to provide the second power supply terminal.

19. A display device comprising the display panel, wherein the display panel comprises multiple pixel driving circuits arranged in an array along a first direction and a second direction, the multiple pixel driving circuits comprise first pixel driving circuits and second pixel driving circuits distributed at intervals along the second direction, the second direction intersects with the first direction, and the display panel further comprises:

a base substrate;

a first metal layer located on a side of the base substrate, wherein the first metal layer comprises multiple fan-out transposition lines, and orthographic projections on the base substrate of the multiple fan-out transposition lines extend along the first direction; and a second metal layer located on a side of the first metal layer away from the base substrate, wherein the second metal layer comprises multiple data signal lines and multiple data fan-out lines, orthographic projections on the base substrate of the multiple data signal lines extend along the second direction and are distributed at intervals along the first direction, and orthographic projections on the base substrate of the multiple data fan-out lines extend along the second direction and are distributed at intervals along the first direction;

wherein the multiple data signal lines comprise multiple first data signal lines and multiple second data signal lines alternately distributed along the first direction, a pixel column corresponds to one of the first data signal lines and one of the second data signal lines, and the first data signal line and the second data signal line are arranged on both sides of the pixel column that the first data signal line and the second data signal line correspond to, and wherein the first data signal line is connected to the first pixel driving circuits, and the second data signal line is connected to the second pixel driving circuits; and wherein at least some of the data signal lines far away from a middle area of the display panel are connected to the fan-out transposition lines, and the fan-out transposition lines are further connected to the data fan-out lines close to the middle area of the display panel;

wherein the first direction is a row direction, the second direction is a column direction, and the display panel further comprises:

an active layer located between the base substrate and the first metal layer, wherein the active layer comprises multiple semiconductor units arranged in an array along the row direction and the column direction, and one of the semiconductor units corresponds to one of the pixel driving circuits;

wherein an orthographic projection on the base substrate of a data fan-out line is located on an orthographic projection on the base substrate of a semiconductor unit in a pixel column that the data fan-out line corresponds to; and wherein at least one of the semiconductor units comprises a storage capacitor, and the orthographic projection on the base substrate of the data fan-out line overlaps with the storage capacitor.

* * * * *